US007095350B2

(12) United States Patent
Hagiwara et al.

(10) Patent No.: US 7,095,350 B2
(45) Date of Patent: Aug. 22, 2006

(54) DA CONVERTER CIRCUIT PROVIDED WITH DA CONVERTER OF SEGMENT SWITCHED CAPACITOR TYPE

(75) Inventors: Hiroyuki Hagiwara, Gunma (JP); Haruo Kobayashi, Gunma (JP); Hao San, Gunma (JP); Atsushi Wada, Gifu (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 11/157,923

(22) Filed: Jun. 22, 2005

(65) Prior Publication Data

US 2005/0285768 A1   Dec. 29, 2005

(30) Foreign Application Priority Data

Jun. 23, 2004   (JP) ............................. P2004-185198

(51) Int. Cl.
*H03M 1/66* (2006.01)
*H03M 3/00* (2006.01)
(52) U.S. Cl. ...................................... 341/150; 341/143
(58) Field of Classification Search ................ 341/118, 341/120, 143, 144, 150, 155, 172, 145; 333/173; 708/823; 375/247, 248
See application file for complete search history.

(56) References Cited

U.S. PATENT DOCUMENTS

| | | | | |
|---|---|---|---|---|
| 4,370,632 A | * | 1/1983 | Allgood et al. ............. | 333/173 |
| 5,818,377 A | * | 10/1998 | Wieser ....................... | 341/144 |
| 5,990,819 A | * | 11/1999 | Fujimori ..................... | 341/150 |
| 6,037,888 A | * | 3/2000 | Nairn ......................... | 341/145 |
| 6,081,218 A | * | 6/2000 | Ju et al. ..................... | 341/150 |
| 6,266,002 B1 | * | 7/2001 | Gong et al. ................. | 341/150 |
| 6,445,324 B1 | * | 9/2002 | Meroni et al. .............. | 341/144 |

(Continued)

FOREIGN PATENT DOCUMENTS

JP           10075177 A       3/1998

OTHER PUBLICATIONS

Norsworthy et al., "Delta-Sigma Data Converters,-Theory, Design, and Simulation", IEEE Press, 1997, pp. 244-245, no month.

(Continued)

*Primary Examiner*—Patrick Wamsley
(74) *Attorney, Agent, or Firm*—Birch, Stewart, Kolasch & Birch, LLP

(57) ABSTRACT

A DA converter circuit is provided for use in a $\Delta\Sigma$ AD modulator. The DA converter circuit includes a DA converter of segment switched capacitor type. The DA converter includes an operational amplifier, capacitors as connected in parallel to each other to supply electric charges to the operational amplifier, an electrically charging switch for switching of electrically charging electric charges onto the respective capacitors or not, and an electrically discharging switch for switching or not electrically discharging electric charges from the respective capacitors or not. A switch device performs either one of the electrically charging, the electrically discharging, grounding, and polarity inversion onto the respective capacitors. A controller controls the electrically charging switch, the electrically discharging switch and the switch device to execute a process of second-order DWA algorithm for performing a second-order noise shaping of a non-linearity of the DA converter circuit.

8 Claims, 16 Drawing Sheets

U.S. PATENT DOCUMENTS

| | | | | |
|---|---|---|---|---|
| 6,535,155 | B1* | 3/2003 | Ruha et al. | 341/144 |
| 6,556,161 | B1* | 4/2003 | Nuijten | 341/144 |
| 6,573,850 | B1* | 6/2003 | Pennock | 341/150 |
| 6,583,742 | B1* | 6/2003 | Hossack | 341/144 |
| 6,611,221 | B1* | 8/2003 | Soundarapandian et al. | 341/143 |
| 6,677,875 | B1* | 1/2004 | Dagher et al. | 341/143 |
| 6,753,800 | B1* | 6/2004 | Ou | 341/144 |

OTHER PUBLICATIONS

C. Toumazou et al. (editors), Trade-Offs in Analog Circuit Design, The Designer's Companion, Kluwer Academic Publishers, 2002, pp. 631, 644-645, no month.

Y Geerts et al., "Design of Multi-bit Delta-Sigma A/D Converters", Kluwer Academic Publishers, 2002 pp. 91-92, no month.

A. Yasuda et al., "A Third Order $\Delta$-$\Sigma$ Modulator Using Second-Order Noise-Shaping Dynamic Element Matching", IEEE Journal of Solid-State Circuits, vol. 33, Dec. 1998, pp. 1879-1886, no date.

H. San et al., "An element rotation algorithm for Multi-bit DAC Nonlinearities in Complex Bandpass $\Delta\Sigma$AD Modulators", IEEE 17th International Conference on VLSI Design, Jan. 2004, pp. 151-156, no date.

H. San et al., "A Noise-Shaping Algorithm of Multi-Bit DAC Nonlinearities in Complex Bandpass $\Delta\Sigma$AD Modulators", IEICE Transactions on Fundamentals, vol. E87-A, No. 4, Apr. 2004, pp. 792-800, no date.

* cited by examiner

| INPUT DATA D(n) | CS0 | CS1 | CS2 | CS3 | CS4 | CS5 | CS6 | CS7 |
|---|---|---|---|---|---|---|---|---|
| 3 | + | + | + | | | | | |
| 4 | | | − | + | + | + | + | + |
| 2 | | | ++ | | | | | |
| 5 | + | | − | + | + | + | + | + |
| 6 | | ++ | ++ | + | + | | | |
| 1 | + | | − | − | − | + | + | + |
| 2 | | − | + | + | + | | | |
| 3 | | ++ | + | | | | | |
| 3 | | − | − | + | + | + | + | + | t ↓

DA CONVERTER CIRCUIT 50

*Fig.9A* MULTI-CLOCK OPERATION
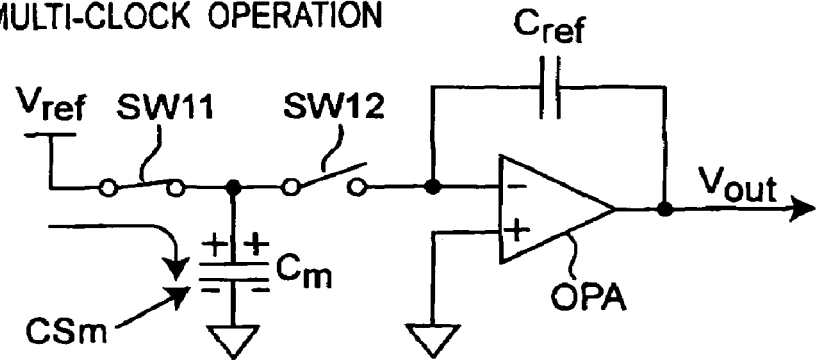
*Fig.9B*
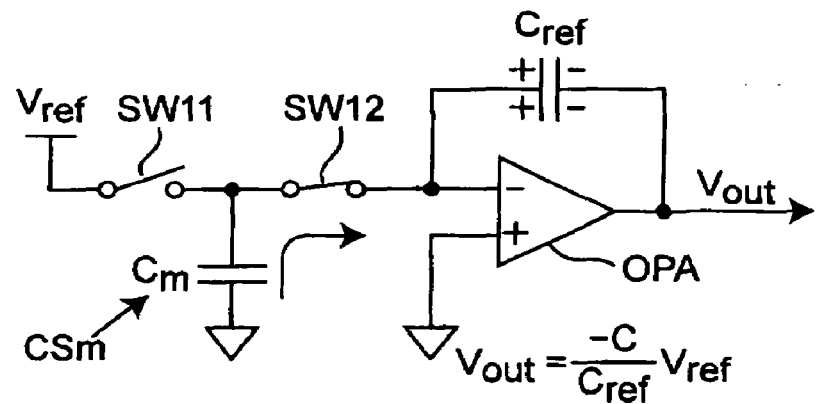
*Fig.9C*
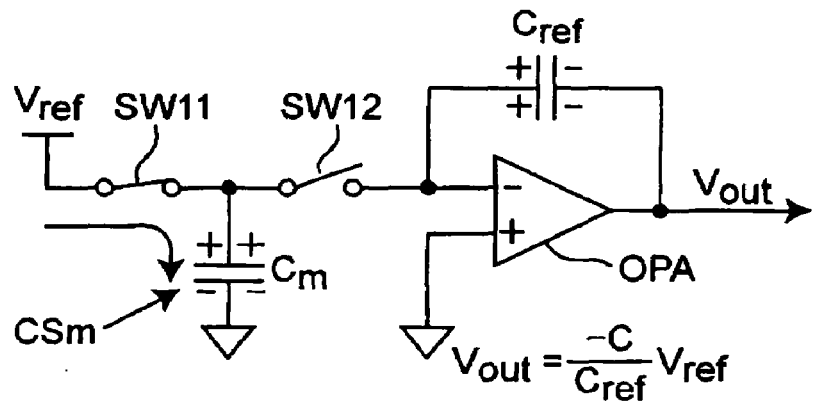
*Fig.9D*
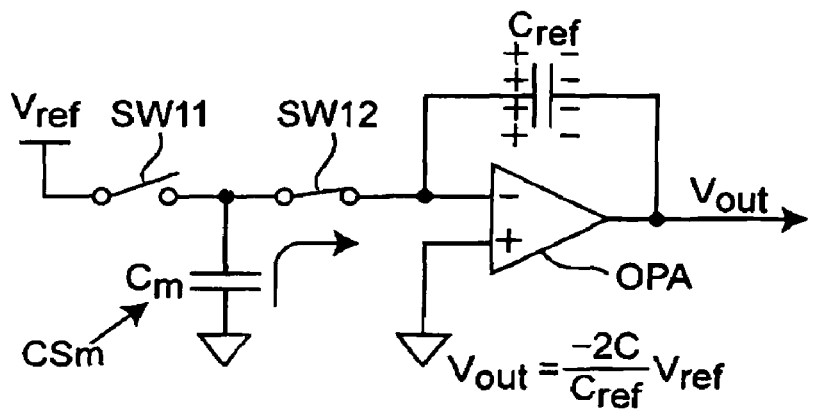

*Fig. 10A* MINUS OPERATION
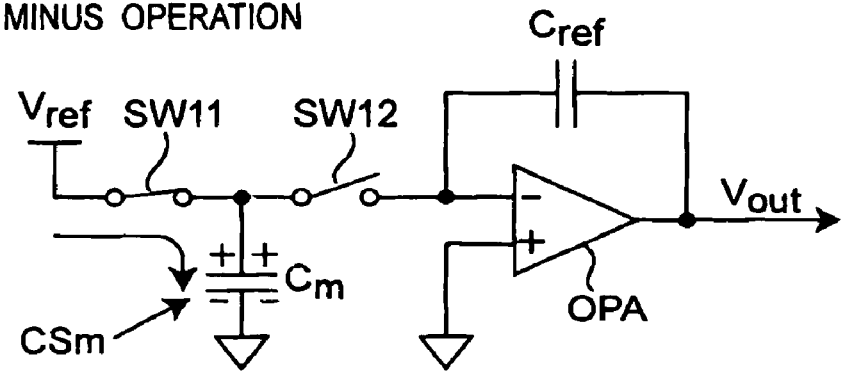
*Fig. 10B*
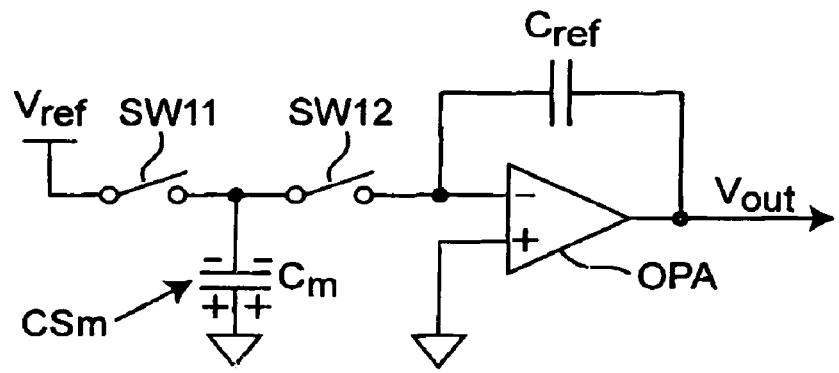
*Fig. 10C*
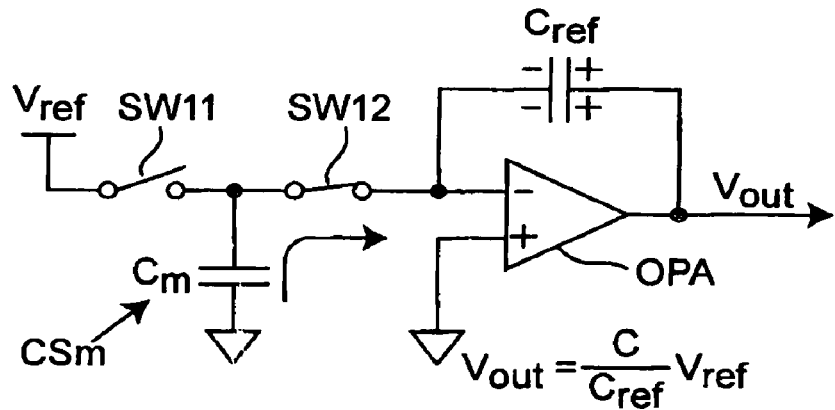

IN THE CASE OF EXECUTING FIRST-ORDER NOISE SHAPING PROCESS USING FIRST-ORDER DWA ALGORITHM

DA CONVERTER CIRCUIT PROVIDED WITH DA CONVERTER OF SEGMENT SWITCHED CAPACITOR TYPE

BACKGROUND OF THE INVENTION

1. Field of the Invention

The present invention relates to a DA converter circuit for use in a $\Delta\Sigma$ AD modulator, and a $\Delta\Sigma$ AD modulator utilizing the same DA converter circuit, and in particular, to a DA converter circuit for use in a $\Delta\Sigma$ AD modulator which is used in apparatuses such as a communication apparatus, a sensor apparatus, an audio apparatus and the like, and a $\Delta\Sigma$ AD modulator utilizing the same DA converter circuit.

2. Description of the Related Art

A signal processing method as employed in a communication system has been rapidly shifting from an analog system to a digital system. When an AD converter circuit in such a system can be successfully shifted to an analog front end, complicated functions, which were conventionally realized in the analog system, the AD converter circuit can be realized by means of a digital signal processing method so that a level of integration and a performance of the whole system can be improved. In order to realize that, a superior linearity, a large dynamic range, a wide signal band and an image signal eliminating ability may be required for the AD converter circuit.

A $\Delta\Sigma$ AD modulator, which is an AD converter circuit using a $\Delta\Sigma$ modulator, is widely applied not only to sound and instrumentation as in the conventional usage but also to the communication system in order to satisfy the needs resulting from a rapid progress in a higher speed and a wider band. The $\Delta\Sigma$ AD modulator is capable of achieving a high precision using oversampling and noise shaping methods. As an advantageous effect upon using a multi-bit $\Delta\Sigma$ AD modulator to further pursue a higher performance, a higher resolution can be obtained with a lower oversampling ratio (hereinafter referred to as an OSR), and possible problems in the stability can be overcome at the same time (for example, See a first patent document).

Documents related to the present invention are as follows:

(1) Japanese Patent Laid-open Publication No. JP-10-075177-A (referred to as a first non-patent document hereinafter);

(2) S. R. Norsworthy, et al. (editors), "Delta-Sigma Data Converters, —Theory, Design, and Simulation", IEEE Press, 1997 (referred to as a first patent document hereinafter);

(3) R. Schreier et al., "Speed vs. dynamic range trade-off in oversampling data converters", C. Toumazou et al. (editors), Trade-Offs in Analog Circuit Design, The Designer's Companion, Kiuwer Academic Publishers, pp. 631, 644 and 645, 2002 (referred to as a second patent document hereinafter);

(4) Y. Geerts al., "Design of Multi-bit Delta-Sigma A/D Converters", Kluwer Academic Publishers, 2002 (referred to as a third patent document hereinafter);

(5) A. Yasuda et al., "A third-order $\Delta$-$\Sigma$ modulator using second-order noise-shaping dynamic element matching", IEEE Journal of Solid-State Circuits, Vol. 33, pp. 1876–1886, December 1998 (referred to as a fourth patent document hereinafter);

(6) H. San et al., "An element rotation algorithm for multi-bit DAC nonlinearities in complex bandpass delta-sigma AD modulators", IEEE 17th International Conference on VLSI Design, Mumbai, India, pp. 151–156, January 2004 (referred to as a fifth patent document hereinafter); and (7) H. San et al., "A Noise-Shaping Algorithm of Multi-bit DAC Nonlinearities in Complex Bandpass $\Delta\Sigma$ AD modulators", IEICE Transactions on Fundamentals, Vol. E87-A, No. 4, pp 792–800 April 2004 (referred to as a sixth patent document hereinafter).

However, in contrast to a one-bit DA converter having a superior linearity, a non-linearity of an internal DA converter of the multi-bit $\Delta\Sigma$ AD modulator is not noise-shaped in the modulator, and this leads to disadvantageous deterioration in the precision of the entire AD converter.

FIG. 1A is a block diagram showing a configuration of a low-pass $\Delta\Sigma$ AD modulator according to a prior art. FIG. 1B is an equivalent circuit diagram of the low-pass $\Delta\Sigma$ AD modulator shown in FIG. 1A.

Referring to FIG. 1A, the low-pass $\Delta\Sigma$ AD modulator includes a subtracter SU1, a low-pass filter LP1, an AD converter AD1, and a DA converter DA1. An analog input signal Ain is inputted to the subtracter SU1. The subtracter SU1 subtracts a feedback signal, which is outputted from the DA converter DA1, from the inputted analog input signal Ain, and then, outputs a signal having the subtraction result to the AD converter AD1 via the low-pass filter LP1 having a predetermined low-pass characteristic. The AD converter AD1 converts the inputted signal into a digital output signal Dout, and outputs the same digital output signal Dout, which is further outputted to the DA converter DA1. Further, the DA converter DA1 DA-converts the inputted digital output signal Dout into an analog signal, and feeds it back to the subtracter SU1.

In the block diagram of the equivalent circuit of FIG. 1B, X (z) corresponds to the analog input signal Ain, while Y(z) corresponds to the digital output signal Dout. The low-pass filter LP1 has a transfer function H (z). In the AD converter AD1, a quantization noise E (z) is added to an adder SM1. In a DA converter SM2, a non-linearity error $\delta(z)$ is added to an adder SM2. In FIG. 1B, M (z) denotes an output signal from the DA converter DA1.

In this case, a relationship between the input signal X (z) and the output signal Y(z) in the low-pass $\Delta\Sigma$ AD modulator of FIG. 1 is represented by the following equation.

$$Y(z) = \frac{H(z)}{1+H(z)}[X(z) - \delta(z)] + \frac{1}{1+H(z)}E(z) \quad (1)$$

As clearly shown in the foregoing equation (1)-the quantization noise E (z) of the internal AD converter AD1 is noise-shaped, while the non-linearity error $\delta(z)$ of the DA converter is directly outputted without any noise-shaping process, and this obviously makes it difficult to realize the $\Delta\Sigma$ AD modulator with a higher precision. Therefore, in order to noise-shape the non-linearity of the internal DA converter of the multi-bit $\Delta\Sigma$ AD modulator, there was proposed a DWA (Data Weighted Averaging; this means averaging data with weighting) algorithm, in which a digital signal processing circuit is provided at the previous stage of the internal DA converter DA1 so that a dynamic element matching is performed (for example, see the second to sixth non-patent document).

Next, a DA converter of segment switched capacitor type and mismatch of its capacitances will be described below.

FIG. 2A is a circuit diagram showing a configuration of the switched capacitor DA converter of segment type according to the prior art. FIG. 2B is a circuit diagram showing an electrically charging operation of the switched capacitor DA converter of segment type shown in FIG. 2A.

FIG. 2C is a circuit diagram showing an electrically discharging operation of the DA converter of segment switched capacitor type shown in FIG. 2A.

The DA converter of segment switched capacitor type having a resolution of nine levels shown in FIG. 2A includes the followings:

(a) eight unit capacitors $C_0$ to $C_7$ as connected in parallel to each other;

(b) an operational amplifier OPA having a feedback capacitor $C_{ref}$;

(c) an electrically charging switch SW11 for supplying a predetermined reference voltage $V_{ref}$ to the respective unit capacitors $C_0$ to $C_7$, respectively;

(d) an electrically discharging switch SW12 for electrically discharging the electric charges stored in the respective unit capacitors $C_0$ to $C_7$ to the operational amplifier OPA; and (e) switches SW0 to SW7 for supplying the reference voltage $V_{ref}$ to the unit capacitors $C_0$ to $C_7$ or grounding the same unit capacitors $C_0$ to $C_7$.

It would be ideal for capacitance values of all of the unit capacitors $C_k$ to be equal to each other, however, the capacitance values are actually different from designed values due to variation in a manufacturing process of an IC chip. The capacitance values are represented by the following equation:

$$C_k \equiv C + e_k \ (k=0, 1, 2, \ldots, 7) \quad (2),$$

$$\text{where } C \equiv (C_0 + C_1 + C_2 + \ldots + C_7)/8 \quad (3), \text{ and}$$

$$e_0 + e_1 + e_2 + \ldots + e_7 = 0 \quad (4).$$

A symbol $e_k$ in the foregoing equation denotes a mismatch value of the capacitance value $C_k$ which is a deviation value from an average capacitance C. As shown in FIG. 2B, when the digital input signal is "m", the electrically charging switch SW11 is turned on, while the switch SW12 is turned off. Further, a number "m" of switches SW0 to SWm−1 are switched over to a contact "a" side thereof so that the unit capacitors $C_0, C_1, C_2, \ldots, C_{m-1}$ are connected to the reference voltage $V_{ref}$. On the other hand, only a number "7−m+1" of other switches SWm to SW7 are switched over to a contact "b" side thereof so that the unit capacitors $C_m, C_{m+1}, \ldots, C_7$ are grounded. In this case, the unit capacitors $C_0, C_1, C_2, \ldots, C_{m-1}$ are supplied with electric charges. Next, after a predetermined time interval, the electrically charging switch SW11 is turned off, while the switch SW12 is turned on, and all of the switches SW0 to SW7 are switched over to the contact "a" side thereof so that the electric charges as stored in the unit capacitors $C_0, C_1, C_2, \ldots, C_{m-1}$ are discharged to the operational amplifier OPA, as shown in FIG. 2C. At that time, an output voltage Vout of the DA converter of segment switched capacitor type is represented by the following equation:

$$V_{out} = -m \frac{C}{C_{ref}} V_{ref} + \delta. \quad (5)$$

A non-linearity $\delta$ of the foregoing DA converter is obtained by the following equation:

$$\delta \equiv -\frac{e_0 + e_1 + e_2 + \ldots + e_{m-1}}{C_{ref}} V_{ref}. \quad (6)$$

As is apparent from the foregoing equation (3), an output power spectrum of the AD converter based on mismatch values $e_0, e_1, \ldots, e_7$ (which equivalently correspond to the non-linearity $\delta$ of the DA converter DA1) is evenly shown in a signal band.

Next, a first-order low-pass DWA algorithm will be described below. FIG. 3A is a block diagram showing a DA converter circuit when the DA converter DA1 according to the prior art is subjected to a first-order noise shape based on a first-order DWA algorithm. FIG. 3B is an equivalent circuit diagram of the DA converter circuit shown in FIG. 3A.

Referring to FIG. 3A, a digital low-pass filter LP11 having the transfer function of $(1/(1-z^{-1}))$ is inserted at the previous stage of the DA converter DA1 having the non-linearity $\delta(z)$, and an analogue high-pass filter HP11 having the transfer function of $(1-z^{-1})$ is inserted at the next stage of the DA converter DA1. A relationship among a digital input signal A1, non-linearity $\delta(z)$ of the DA converter DA1 and analog output signal A4 is represented by the following equation:

$$A_4(z) = A_1(z) + (1-z^{-1})\delta(z) \quad (7).$$

As shown in FIG. 3A, the low-pass filter LP11 of FIG. 3A includes an adder SM11, and a delay circuit DL11 for delaying an output signal from the adder SM11 by a predetermined clock cycle and thereafter feeding back the same delayed output signal to the adder SM11. As is apparent from FIG. 3, the non-linearity $\delta(z)$ of the DA converter DA1 is subjected to the first-order noise shape by the high-pass filter HP11 having the transfer function of $(1-z^{-1})$. As shown in FIG. 3B, the high-pass filter HP11 of FIG. 3A includes a subtracter SU11 and a delay circuit DL21 for delaying a signal inputted to the subtracter SU11 by a predetermined clock cycle and thereafter inputting the delayed signal to the subtracter SU11.

However, it is not possible in reality to realize the circuit described above. For example, when a digital input signal $A_1$ (n) is always an integer 2, an input signal $A_2$ (n) to the DA converter DA1 is infinite in accordance with the increase of a timing "n", leading the DA converter DA1 to exceed its input range, as a result of which the DA conversion becomes impossible. In order to deal with the situation, the first-order DWA algorithm capable of equivalently realizing the circuit of FIG. 3 was proposed (for example, See the second patent document)-the first-order DWA algorithm will be described below.

The followings are assumed for the DA converter of segment switched capacitor type.

(A) Respective capacity cells CSm (m=0, 1, 2, ..., 7) of the DA converter of segment switched capacitor type are arranged in a ring shape as shown in FIG. 4. Each of the capacity cells CSm includes a capacitor Cm and a switch SWm for connecting the capacitor Cm to a ring connecting line RR. Further, the ring connecting line RR is connected to the reference voltage source $V_{ref}$ via the electrically charging switch SW11 and also connected to a non-inversion input terminal of the operational amplifier OPA having the feedback capacitor $C_{ref}$.

(B) A pointer for memorizing a position of the capacity cell as turned on is provided in the DA converter. An indicated value of the pointer at a timing "n" is P (n), and at a timing "n+1", the P (n)-th capacity cell is selected in accordance with inputted data, and then, it is turned on. Based on the foregoing configuration, the following operation is carried out.

(C) It is assumed that the input data signal is $A_1$ (n)=$\alpha_n$ (n=0, 1, 2, 3, ...) at the timing "n".

(D) Respective switches of a number $\alpha_n$ of capacity cells CS (mod$_8$ (P (n)+1)), CS (mod$_8$ (P (n)+2)), CS (mod$_8$ (P (n)+3)), ..., CS (mod$_8$ (P (n)+$\alpha_n$)) are turned on so that they are connected to the reference voltage source V$_{ref}$ of FIG. 2B. In the present specification, in place of a general notation "x modulo y" or "x mod y" which represents a remainder as obtained when x is divided by y, a simplified notation "mod$_{yx}$" is used for the description.

(E) The indicated value of the pointer at the timing "n+1" is set to P (n+1)=mod$_8$ (P (n)+$\alpha_n$). As described, when the capacity cell whose switch is turned on is selected, the mismatch value of the capacity cell (that is the non-linearity $\delta(z)$ of the DA converter DA1) is subjected to the first-order noise shape.

By the way, the $\Delta\Sigma$ AD converter included such problems that power consumption of the AD converter was relatively large and a chip area unfavorably increased due to its higher OSR. In order to solve the problems, they have paid attention to transformation of the $\Delta\Sigma$ AD modulator into the multi-bit configuration to reduce the OSR. However, the multi-bit DA converter includes a non-linearity resulting from the matching precision of the apparatus as described earlier, and this may unfavorably cause an adverse influence on the performance of the entire AD converter. In particular, the foregoing problem is even worse when fine processing is adopted to promote downsizing and high speed.

In order to overcome such problems, the low-pass element rotation method utilizing the first-order noise shaping was proposed as described above, however, the method can only exert a limited effect in obtaining a higher signal to noise ratio (SNR). On the other hand, the second-order noise shaping method has been proposed, however, it is not suitable for practical use because a required circuit configuration is too complicated.

SUMMARY OF THE INVENTION

An essential object of the present invention is to provide a DA converter circuit and a $\Delta\Sigma$ AD modulator utilizing the same DA converter circuit, each having a simplified configuration as compared with that of the prior art, and each capable of noise-shaping a non-linearity thereof.

In order to achieve the aforementioned objective, according to one aspect of the present invention, there is provided a DA converter circuit including a DA converter of segment switched capacitor type. The DA converter includes an operational amplifier having a feedback capacity, a number $M=2^L$ of capacitors, an electrically charging switch, and an electrically discharging switch. The capacitors are connected in parallel to each other so as to supply electric charges to the operational amplifier. The electrically charging switch switches over between performing and not performing of electrically charging electric charges onto the respective capacitors. The electrically discharging switch switches over between performing and not performing of electrically discharging electric charges from the respective capacitors.

The DA converter circuit further includes a switch device, and a controller. The switch device performs either electrically charging, the electrically discharging, grounding, or polarity inversion onto the respective capacitors. The controller controls the electrically charging switch, the electrically discharging switch and the switch device so as to execute a process of second-order DWA algorithm for performing a second-order noise shaping of a non-linearity of the DA converter circuit for a low-pass $\Delta\Sigma$ AD modulator, using a "+2" operation, a "+1" operation, a "0" operation, and a "−1" operation. The "+2" operation performs the electrically charging and the electrically discharging twice onto the respective capacitors for a predetermined time interval to generate an output voltage which is a voltage of +2 times a predetermined reference output voltage. The "+1" operation performs the electrically charging and the electrically discharging once onto the respective capacitors for the time interval to generate an output voltage which is a voltage of +1 times the reference output voltage. The "0" operation does not perform any electrically charging and electrically discharging onto the respective capacitors for the time interval to generate an output voltage which is a voltage of a grounding electric potential. The "−1" operation performs the electrically charging once onto the respective capacitors and thereafter inverting polarities of the respective capacitors for the time interval to generate an output voltage which is a voltage of −1 times the reference output voltage.

In the above-mentioned DA converter circuit, the capacitors are equivalently constituted in a ring shape, and the controller controls the electrically charging switch, the electrically discharging switch and the switch device by executing the following steps. Based on input data D(n), the controller calculates control parameters for controlling the switch device of the respective capacitors using the second-order DWA algorithm, where the control parameters includes:

(a) a positive-side pointer indicated value $P_{0+}(n)$;
(b) a positive-side signal starting position $S_{0+}(n)$;
(c) a positive-side allocation number $A_{0+}(n)$;
(d) a negative-side pointer indicated value $P_{0-}(n)$;
(e) a negative-side signal starting position $S_{0-}(n)$; and
(f) a negative-side allocation number $A_{0-}(n)$.

In respective capacity cells including the respective capacitors, and the switch device connected to the respective capacitors, the controller allocates a "positive digit" to $S_{0+}(n)$-th, mod$_M(S_{0+}(n)+1)$-th, mod$_M(S_{0+}(n)+2)$-th, ..., and mod$_M(S_{0+}(n)+A_{0+}(n)-1)$-th capacity cells, and allocating a "negative digit" to $S_{0-}(n)$-th, mod$_M(S_{0-}(n)+1)$-th, mod$_M(S_{0-}(n)+2)$-th, ..., and mod$_M(S_{0-}(n)+A_{0-}(n)-1)$-th capacity cells. Then the controller sets a number of times of allocations of the positive digit to a m-th capacity cell to Nmp, and sets a number of times of allocations of the negative digit to the m-th capacity cell to Nmn. Thereafter, the controller sets the "+2" operation onto the m-th capacity cell when Nmp=Nmn+2; sets the "+1" operation onto the m-th capacity cell when Nmp=Nmn+1, sets the "0" operation onto the m-th capacity cell when Nmp=Nmn, and sets the "−1" operation onto the m-th capacity cell in any case other than the foregoing cases.

In the above-mentioned DA converter circuit, preferably L=3, and the DA converter includes a number m=8 of capacitors so that the DA converter circuit is of eight bits.

According to another aspect of the present invention, there is provided a $\Delta\Sigma$ AD modulator including a DA converter circuit, a subtracter, a low-pass filter, and an AD converter circuit. The subtracter subtracts a signal outputted from the DA converter circuit from an inputted analog signal and outputs a signal having a subtraction result. The low-pass filter performs a predetermined low-pass filtering process onto the analog signal outputted from the subtracter and outputs a filtered signal. The AD converter circuit AD-converts the analog signal outputted from the low-pass filter into a digital signal and outputs the AD-converted digital signal and further outputting the digital signal to the subtracter via the DA converter circuit. The DA converter circuit includes a DA converter of segment switched capacitor type.

Therefore, according to the present invention, there can be provided the DA converter circuit, whose configuration is simpler than that of the prior art, and which is capable of noise-shaping the non-linearity thereof, and the ΔΣ AD modulator using the same DA converter circuit. Accordingly, even in the case of a low-precision device such as a device which is made by the fine processing, the non-linearity of the multi-bit DA converter can be easily controlled, and a signal to noise ratio (SNR) as high as an ideal level can be first available in the practical use.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIGS. 9A, 9B, 9C and 9D show a multi-clock operation in a capacity cell CSm of the DA converter of the segment switched capacitor type 20 shown in FIG. 8;

FIG. 9A is a circuit diagram showing a first electrically charging operation;

FIG. 9B is a circuit diagram showing a first electrically discharging operation;

FIG. 9C is a circuit diagram showing a second electrically charging operation;

FIG. 9D is a circuit diagram showing a second electrically discharging operation;

FIGS. 10A, 10B and 10C show a minus operation in the capacity cell CSm of the DA converter of the segment switched capacitor type 20 shown in FIG. 8;

FIG. 10A is a circuit diagram showing an electrically charging operation;

FIG. 10B is a circuit diagram showing an electric charge holding operation;

FIG. 10C is a circuit diagram showing an electrically discharging operation;

DETAILED DESCRIPTION OF THE PREFERRED EMBODIMENTS

Hereinafter, preferred embodiments of the present invention will be described with reference to the drawings. In the description below, components each having the same function are denoted by the same numerical references, respectively.

In a preferred embodiment of the present invention, in order to realize a low-pass ΔΣ AD modulator, an algorithm for an AD converter circuit for performing a second-order noise shaping to a non-linearity of a DA converter whose circuit can be relatively easily realized will be described. Further, a hardware circuit using a switched capacitor circuit for realizing the algorithm will be described.

Figure 5A:
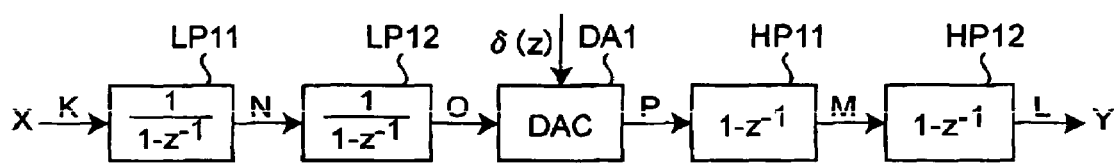
FIG. 5A is a block diagram showing a DA converter circuit when a non-linearity of a DA converter DA1 is subjected to a second-order noise shaping according to a preferred embodiment of the present invention.
Figure 5B:
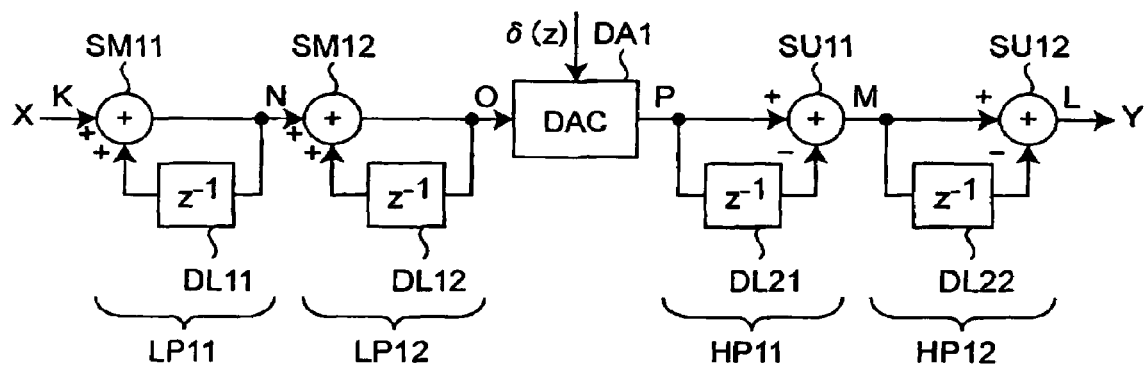
FIG. 5B is an equivalent circuit diagram of the DA converter circuit of FIG. 5A.

FIG. 5A is a block diagram showing a DA converter circuit when the non-linearity of the DA converter DA1 is subjected to the second-order noise shaping according to the present preferred embodiment. FIG. 5B is an equivalent circuit diagram of the DA converter circuit of FIG. 5A. In the present preferred embodiment, there are proposed not only a second-order DWA algorithm as an extension of the first-order DWA algorithm, but also a circuit for realizing the same second-order algorithm.

As shown in FIG. 5A, two low-pass filters (digital integral filters) LP11 and LP12 are provided at the previous stage of the DA converter DA1, and two high-pass filters (analog differential filters) HP11 and HP12 are provided at the next stage of the DA converter DA1. In this case, X denotes a digital input signal, Y denotes an analog output signal, and δ(z) denotes a non-linearity of the DA converter DA1, then the following relationship is obtained:

$$Y(z)=X(z)+(1-z^{-1})^2 \cdot \delta(z) \tag{8}$$

Figure 3A:
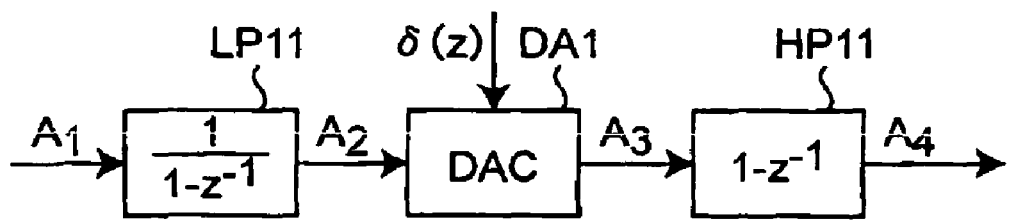
FIG. 3A is a block diagram showing a DA converter circuit when a DA converter DA1 according to a prior art is subjected to a first-order noise shape based on a first-order DWA algorithm.
Figure 3B:
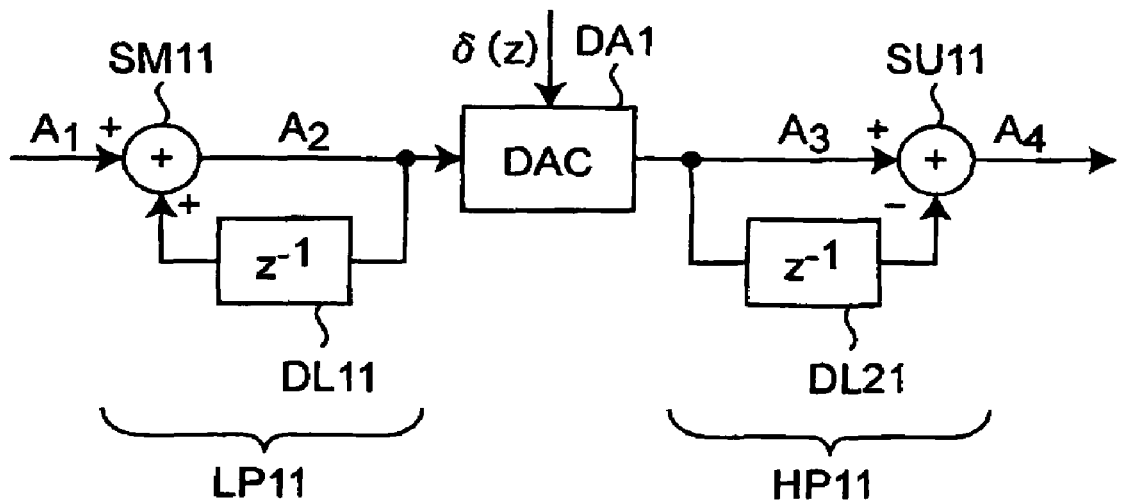
FIG. 3B is an equivalent circuit diagram of the DA converter circuit shown in FIG. 3A.

As shown in FIG. 5B, the low-pass filter LP11 of FIG. 5A includes an adder SM11 and a delay circuit DL11 for delaying an output signal from the adder SM11 by a predetermined clock cycle and thereafter feeding back the same delayed output signal to the adder SM11 in a manner similar to that of FIG. 3. As shown in FIG. 5B, the low-pass filter LP12 of FIG. 5A includes an adder SM12 and a delay circuit DL12 for delaying an output signal from the adder SM12 by a predetermined clock cycle and thereafter feeding back the same delayed output signal the adder SM12. Further, as shown in FIG. 5B, the high-pass filter HP11 of FIG. 5A includes a subtracter SU11, and a delay circuit DL21 for delaying a signal inputted to the subtracter SU11 by a predetermined clock cycle and thereafter inputting the delayed signal to the subtracter SU11 in a manner similar to that of FIG. 3. As shown in FIG. 5B, the high-pass filter HP12 of FIG. 5A includes a subtracter SU12 and a delay circuit DL22 for delaying a signal inputted to the subtracter SU12 by a predetermined clock cycle and thereafter inputting the delayed signal to the subtracter SU12.

Figure 4:
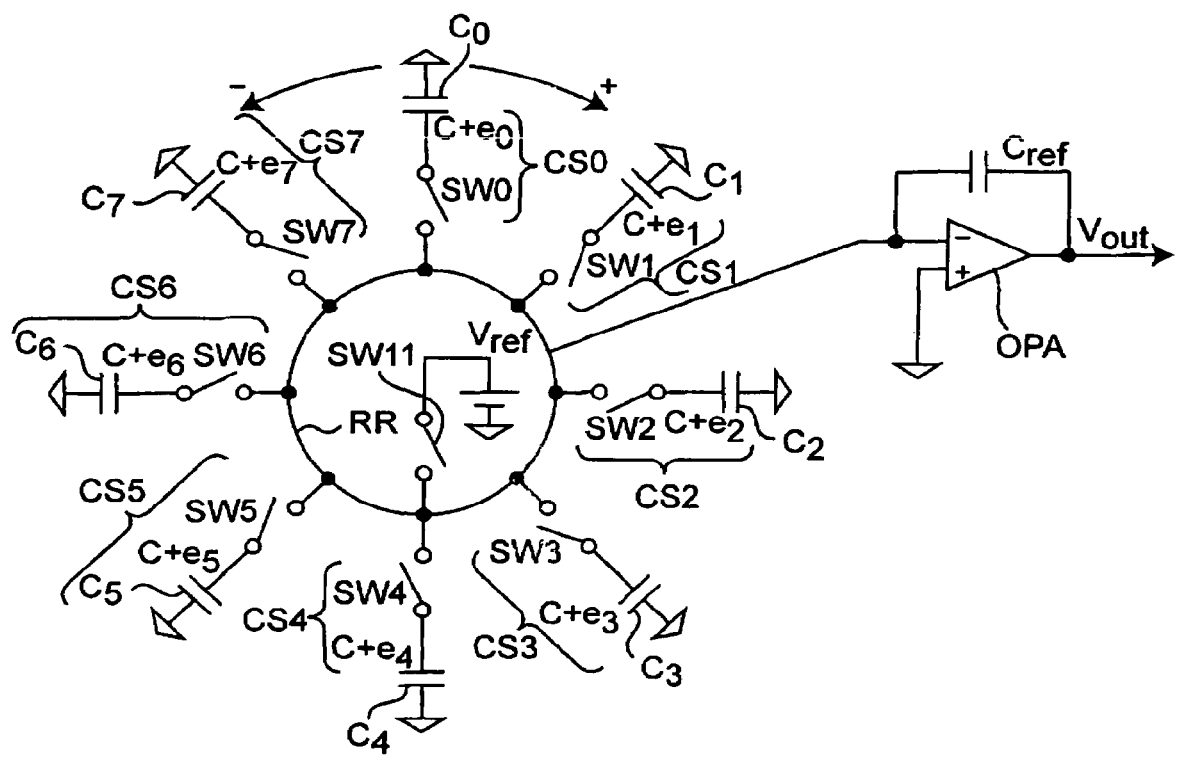
FIG. 4 is a circuit diagram showing a configuration of a DA converter of segment switched capacitor type, in which capacity cells used in the DA converter circuit of FIG. 3 are arranged in a ring shape.

It is clearly understood from the foregoing equation (5) that the non-linearity δ(z) of the DA converter DA1 is subjected to the second-order noise shaping. As described earlier, the configuration of FIG. 4 cannot be directly realized due to the limited input range of the DA converter DA1. In a manner similar to that of the first-order DWA algorithm, it is proposed that the configuration is equivalently realized by arranging the respective capacity cells CS0 to CS7 in a ring shape as shown in FIG. 4.

Next, the second-order DWA algorithm proposed by the inventors of the present invention will be described below. The algorithm is characterized in that the respective capacity cells CS0 to CS7 of the DA converter of segment switched capacitor type have multiple values in the range of −1, 0, 1 and 2.

First of all, below will be described setting of a pointer for showing which capacity cell is selected in the DA converter of segment switched capacitor type arranged in a ring shape shown in FIG. 4.

In this case, input data inputted to the DA converter DA1 at a set timing "n" is D (n), then the following relationship is obtained. An indicated value of a pointer on a positive side is defined as $P_{0+}(n)$, an indicated value of a pointer on a negative side is defined as $P_{0-}(n)$, a signal starting position on the positive side is defined as $S_{0+}(n)$, a signal starting position on the negative side is defined as $S_{0-}(n)$, an allocation number on the positive side is defined as $A_{0+}(n)$, and an allocation number on the negative side is defined as $A_{0-}(n)$.

(A) Positive Side:

$$P_{0+}(n) = mod_8 \left[ D(n-1) + \sum_{k=0}^{n-2} P_{0+}(k) \right], \tag{9}$$

$$S_{0+}(n) = mod_8[P_{0+}(n) + 1], \tag{10}$$

and $$A_{0+}(n) = D(n) + mod_8(A_{0+}(n-1)), \tag{11}$$

(B) Negative Side:

$$P_{0-}(n)=P_{0+}(n-1) \tag{12},$$

$$S_{0-}(n)=mod_8[P_{0+}(n-1)+1] \tag{13, and}$$

$$A_{0-}(n)=mod_8(A_{0+}(n-1)) \tag{14}.$$

Next, the following allocation rules R1 and R2 of allocating "positive digit" and "negative digit" to the respective capacity cells will be described.

(R1) "positive digit" is allocated to $S_{0+}(n)$-th, $mod_8(S_{0+}(n)+1)$-th, $mod_8(S_{0+}(n)+2)$-th, . . . , and $mod_8(S_{0+}(n)+A_{0+}(n)-1)$-th cells.

(R2) "negative digit" is allocated to $S_{0-}(n)$-th, $mod_8(S_{0-}(n)+1)$-th, $mod_8(S_{0-}(n)+2)$-th, . . . , and $mod_8(S_{0-}(n)+A_{0-}(n)-1)$-th cells.

In this case, when "+" is allocated to an m-th capacity cell CSm k+2 times, "−" is allocated to the capacity cell k, k+1, k+2 or k+3 times, where k is an optional natural number. A divisor (or base) in a "mod operation" according to the allocation rules R1 and R2 is eight because of the three-bit DA conversion, and it is M in the case of an $M=2^L$-bit DA conversion.

Further, a method of determining the values of the respective capacity cells, −1, 0, 1 and 2, will be described below.

Which of the values, −1, 0, 1 and 2, the m-th capacity cell CSm (m=1, 2, . . . , 7) takes is determined based on the following conditions:

(1) The value of the capacity cell is set to "+1", when the positive digit is allocated k+2 times and the negative digit is allocated k+1 times according to the allocation rules (R1) and (R2), or when the positive digit is allocated twice and the negative digit is allocated once according to the allocation rules (R1) and (R2).

(2) The value of the capacity cell is set to "2" when the positive digit is allocated k+2 times and the negative digit is allocated k times.

(3) The value of the capacity cell is set to "0" when the positive digit is allocated k+2 times and the negative digit is allocated k+2 times.

(4) The value of the capacity cell is set to "−1" when the positive digit is allocated k+2 times and the negative digit is allocated k+3 times.

Below will be described an output signal Vout of the DA converter DA1 when the algorithm is used.

Figure 1A:
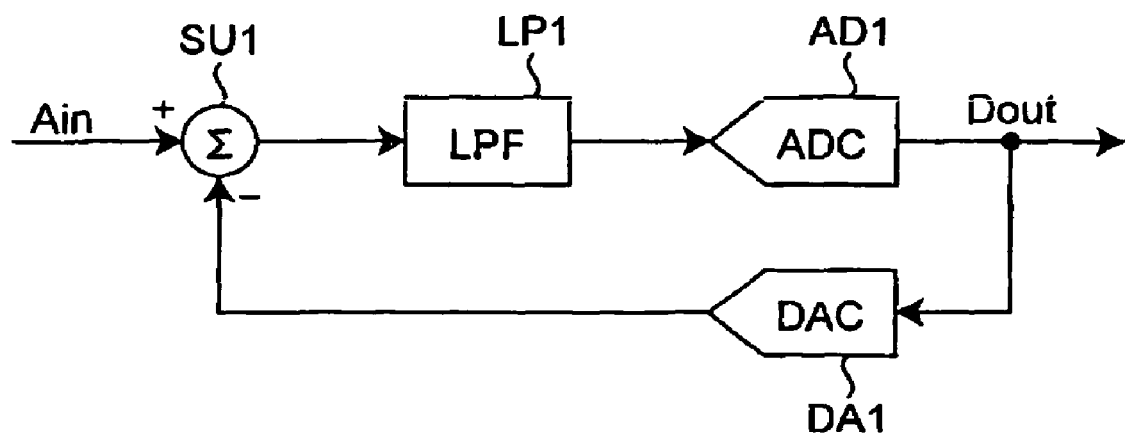
FIG. 1A is a block diagram showing a configuration of a low-pass ΔΣ AD modulator according to a prior art.
Figure 1B:
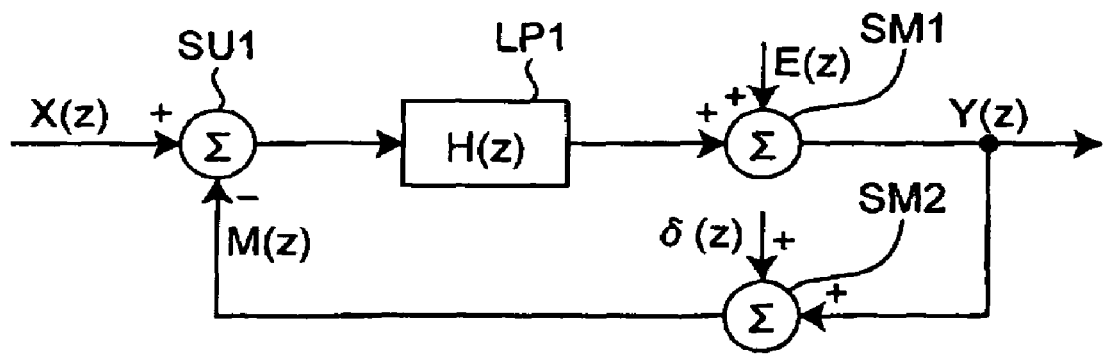
FIG. 1B is an equivalent circuit diagram of the low-pass ΔΣ AD modulator shown in FIG. 1A.
Figure 2A:
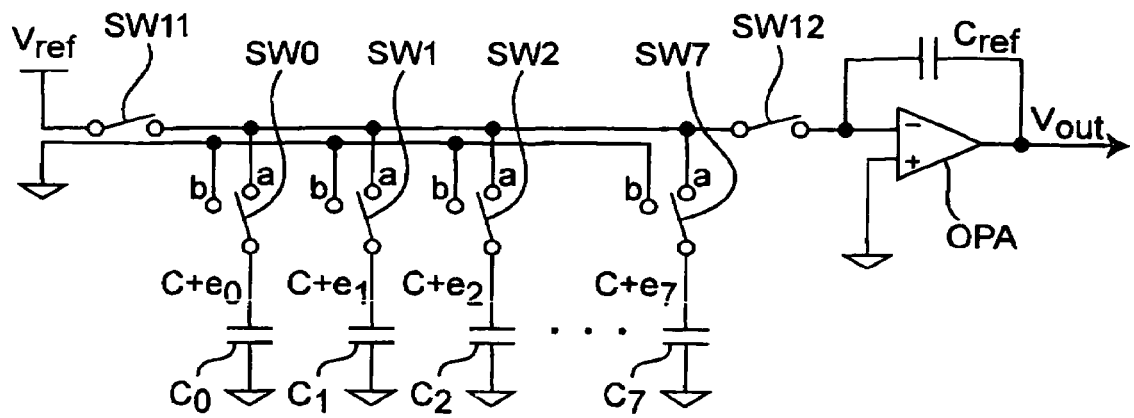
FIG. 2A is a circuit diagram showing a configuration of a switched capacitor DA converter of segment type according to a prior art.
Figure 2B:
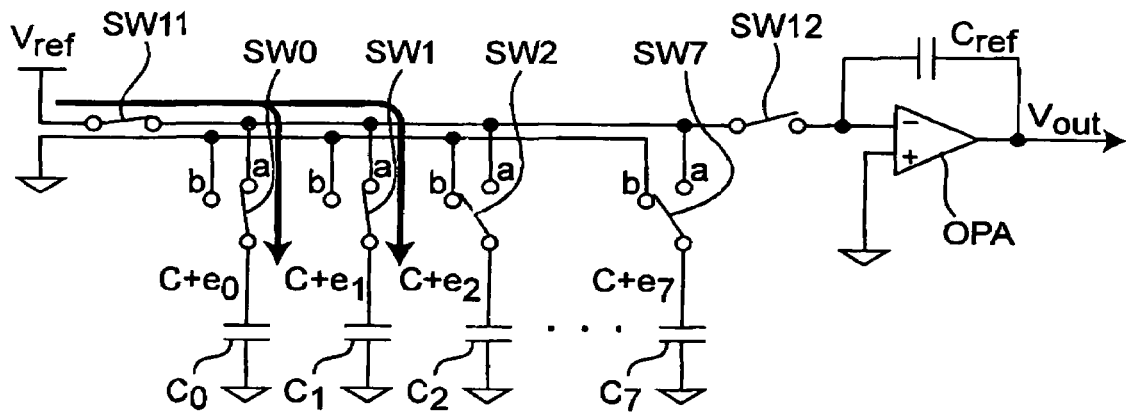
FIG. 2B is a circuit diagram showing an electrically charging operation of the switched capacitor DA converter of the segment type shown in FIG. 2A.
Figure 2C:
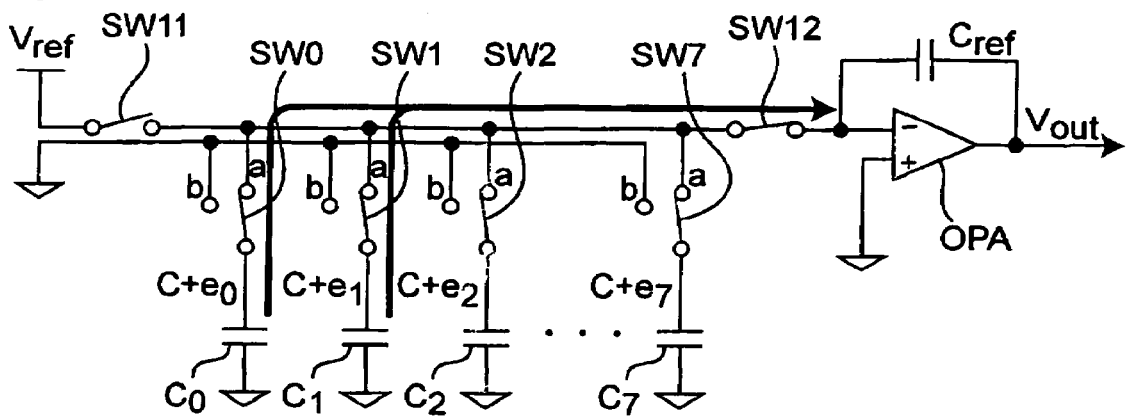
FIG. 2C is a circuit diagram showing an electrically discharging operation of the switched capacitor DA converter of the segment type shown in FIG. 2A.

When the input data D (n)=3, the output signal from the conventional DA converter of segment switched capacitor type of FIG. 2 can be always represented by the following equation:

$$V_{out} = -\frac{C_0 + C_1 + C_2}{C_{ref}} V_{ref} \tag{15}$$

$$= -\frac{3C}{C_{ref}} V_{ref} - \frac{e_0 + e_1 + e_2}{C_{ref}} V_{ref}.$$

As a possible case when the second-order DWA algorithm is used, for example, the value of the first capacity cell is set to −1, the values of the second, third, fourth and fifth capacity cells are set to +1, respectively, and the values of the rest of the capacity cells are set to zero, respectively. In this case, the output signal Vout is represented by the following equation:

$$V_{out} = -\frac{-C_1 + C_2 + C_3 + C_4 + C_5}{C_{ref}} V_{ref} \quad (16)$$

$$= -\frac{3C}{C_{ref}} V_{ref} - \frac{-e_1 + e_2 + e_3 + e_4 + e_5}{C_{ref}} V_{ref}.$$

As a possible case at a different timing, even though the input data D (n) is 2 in a manner similar to above, the value of the third capacity cell is 2, the value of the fourth capacity cell is set to +1, and the values of the rest of the capacity cells are set to zero, respectively. In this case, the output signal Vout is represented by the following equation:

$$V_{out} = -\frac{2C_3 + C_4}{C_{ref}} V_{ref} \quad (17)$$

$$= -\frac{3C}{C_{ref}} V_{ref} - \frac{2e_3 + e_4}{C_{ref}} V_{ref}.$$

Figures 6, 7:
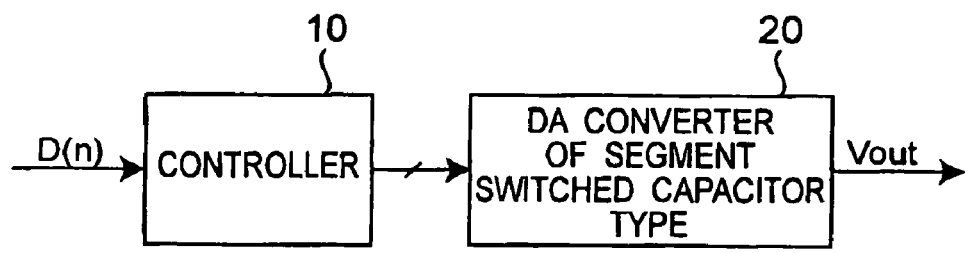
FIG. 6 shows an example of an operation of the DA converter circuit of FIG. 5, and shows setting of respective capacity cells CSm (m=0, 1, 2, . . . , 7) in accordance with input data D(n)
FIG. 7 is a block diagram showing a configuration of a DA converter circuit 50 according to a preferred embodiment of the present invention.

Next, an example of an operation of the DA converter of segment switched capacitor type in which the before-mentioned DWA algorithm is used will be described below. FIG. 6 shows an example of the operation of the DA converter circuit of FIG. 5B, and shows setting of the respective capacity cells CSm (m=0, 1, 2, . . . , 7) in accordance with input data D(n).

Referring to FIG. 6, when the input signal to the DA converter changes in an order of 3, 4, 2, 5, 6, 1, . . . , the values of the capacity cells as obtained according to the second-order DWA algorithm are shown. The operation of this case is as follows.

(Step SS1) When a digital input D (0) is "3" at a first timing n=0, "3" is directly outputted without any change, and the values of the capacity cells CS0, CS1 and CS2 becomes "+1".

(Step SS2) Next, when "4" is inputted (D(1)=4), a number (3+4=7) of capacity cells, which is an integral value of the input signal from the third capacity cell CS3 and thereto, becomes "+". More concretely, "+" is allocated to the capacity cells CS3, CS4, CS5, CS6, CS7, CS0 and CS1. On other hand, "−" is allocated to the capacity cells CS0, CS1 and CS2 because of "3", which is an input signal as used at one previous timing. The values of the capacity cells CS0 and CS1 to which "+" and "−" are both allocated once each becomes "0". The value of the capacity cell CS2 to which only "−" is allocated once becomes "−1", and the values of the capacity cells CS3, CS4, CS5, CS6 and CS7 to which only "+" is allocated once becomes "+1".

(Step SS3) Next, when "2" is inputted (D(2)=2), a number (3+4+2=9) of capacity cells, which is an integral value of the inputted signal from the second capacity cell CS2 and thereto, becomes "+". More concretely, "+" is allocated to the capacity cells CS2, CS3, CS4, CS5, CS6, CS7, CS0, CS1 and CS2, while "−" is allocated to the capacity cells CS3, CS4, CS5, CS6, CS7, CS0 and CS1 because of "7", which is an integral value of input signals at one previous timing. Since "+" is allocated to the capacity cell CS2 twice, the value thereof becomes "+2". The values of the capacity cells CS0 and CS1, to which "+" and "−" are both allocated once each, becomes "0".

Next, a DA convert circuit 50 will be described below in which the second-order DWA algorithm is applied to the DA converter of segment switched capacitor type. FIG. 7 is a block diagram showing a configuration of the DA converter circuit 50 according to a preferred embodiment of the present invention.

Referring to FIG. 7, the DA converter circuit 50 includes a controller 10 for executing the second-order DWA algorithm based on the input data D (n) and controlling respective switches of a DA converter of segment switched capacitor type 20 and the DA converter of segment switched capacitor type 20 for outputting an output signal Vout after the DA conversion, the DA converter being controlled by the controller 10. The controller 10 may be constituted by a combination of a digital sequence circuit and a clock generator circuit.

Figure 8:
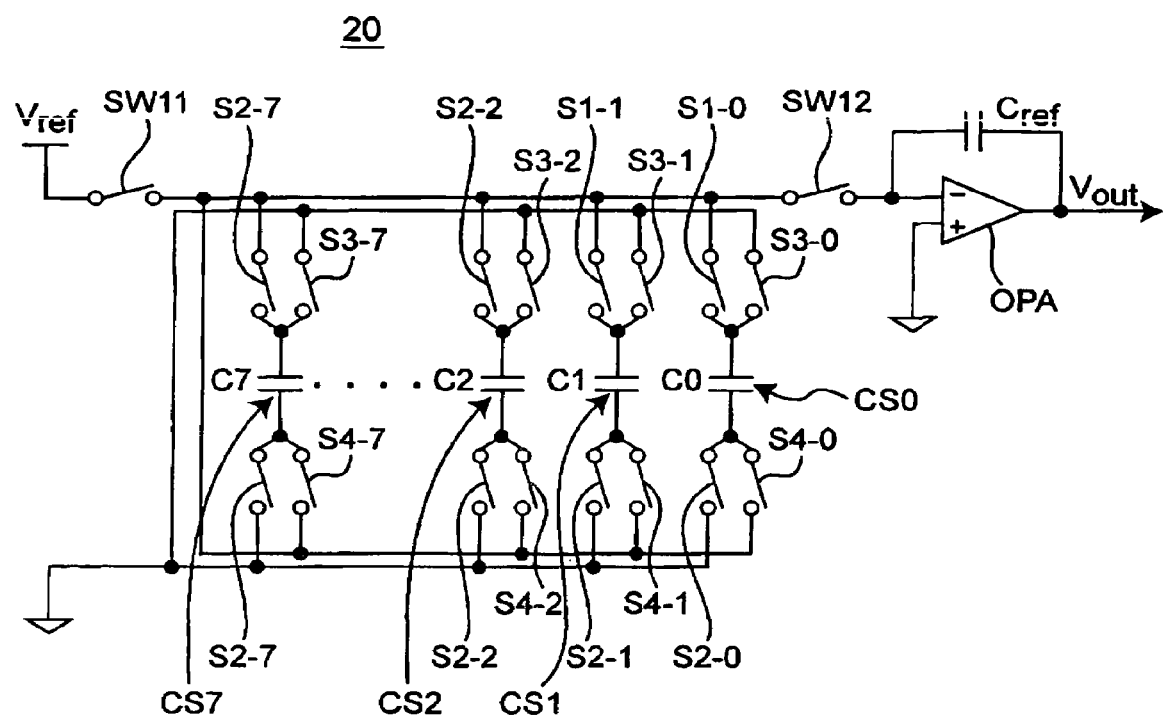
FIG. 8 is a circuit diagram showing a detailed configuration of a DA converter of segment switched capacitor type 20 shown in FIG. 7.

FIG. 8 is a circuit diagram showing a detailed configuration of the DA converter 20 of segment switched capacitor type shown in FIG. 7. The DA converter 20 of segment switched capacitor type shown in FIG. 8 is different from the DA converter 20 of the segment switched capacitor type shown in FIG. 2A in the following points.

(1) In place of the switches SWm for electrically charging the respective capacitors Cm (m=0, 1, 2, . . . , 7) of FIG. 2A or grounding them, switches S1-m to which a reference voltage source $V_{ref}$ is connected via a switch SW11 for electrically charging and switches S3-m connected to the ground are inserted on one side of respective capacitors Cm, while switches S4-m to which the reference voltage source $V_{ref}$ is connected via the electrically charging switch SW11 and switches S2-m connected to the ground are inserted on another side of the respective capacitors Cm in order to provide the respective capacitors Cm with a function of polarity inversion (for minus operation described later), in addition to the functions of electrically charging, electrically discharging and grounding. The switches S1-m to S4-m (where m=0, 1, 2, . . . , 7) operate for the electrically charging, electrically discharging and grounding onto the capacitors Cm, and also the inversion of polarities of the capacitors Cm.

(2) In the case of positive electrically charging or discharging, the switches S1-m and switches S2-m are turned on, while the switches S3-m and switches S4-m are turned off. In the case of inverted negative electrically charging or discharging, the switches S1-m and switches S2-m are turned off, while the switches S3-m and switches S4-m are turned on.

(3) the electrically charging switch SW11 and a switch for electrically discharging SW12 fundamentally operate in a manner similar to that of FIG. 2A, though the electrically charging and discharging are carried out twice for one clock cycle in a multi-clock operation.

More concretely, doubled output signals and minus output signals from the capacity cells are required for realizing the second-order DWA algorithm. In order to achieve this in the DA converter of segment switched capacitor type, there are used the "multi-clock operation (two-clock operation) and "minus operation", which will be described below.

FIGS. 9A, 9B, 9C and 9D show a multi-clock operation in the capacity cell CSm of the DA converter 20 of segment switches capacitor type shown in FIG. 8. FIG. 9A is a circuit diagram showing a first electrically charging operation, FIG. 9B is a circuit diagram showing a first electrically discharging operation, FIG. 9C is a circuit diagram showing a second electrically charging operation, and FIG. 9D is a circuit diagram showing a second electrically discharging operation. In FIGS. 9A to 9D, only one capacity cell CSm is shown for simplification of the description.

After the first electrically charging is carried out by turning on the electrically charging switch SW 11 and turning off the electrically discharging switch SW12 of FIG. 9A, the first electrically discharging is carried out by turning off the electrically charging switch SW11 and turning on the electrically discharging switch SW12 in FIG. 9B, and a unit voltage is held or retained in the operational amplifier OPA. Next, the second electrically charging is carried out by turning on the electrically charging switch SW 11 and turning off the electrically discharging switch SW12 in FIG. 9C, and then, the second electrically discharging is carried out by turning off the electrically charging switch SW11 and turning on the electrically discharging switch SW12, and a voltage equal to the doubled unit voltage is held or retained in the operational amplifier OPA. More concretely, in the multi-clock operation in which the "+2" operation is executed on the capacity cells CSm, the twofold charges can be transmitted as the output voltage in such manner that the electric charge is stored twice for one clock and then is transmitted.

FIGS. 10A, 10B and 10C show a minus operation in the capacity cell CSm of the DA converter 20 of segment switched capacitor type of FIG. 8. FIG. 10A is a circuit diagram showing an electrically charging operation, FIG. 10B is a circuit diagram showing an electric charge holding operation, and FIG. 10C is a circuit diagram showing an electrically discharging operation. In FIGS. 10A to 10C, only one capacity cell CSm is shown for simplification of the description.

After the electrically charging operation is carried out by turning on the electrically charging switch SW11 and turning off the electrically discharging switch SW12 in FIG. 10A, the capacitor Cm is inversely connected so as to obtain the minus polarity in the electric charge holding state with the switches SW11 and SW12 both being turned off in FIG. 10B. In FIG. 10C, the electrically discharging operation is carried out by turning off the electrically charging switch SW11 and turning on the electrically discharging switch SW12 in FIG. 10C, and the electric charges are outputted to the operational amplifier OPA. More concretely, in the minus operation in which the "−1" operation is executed on the capacity cell CSm, the electric charges are once charged, and held or retained, and then, the capacitor Cm is connected so that plus and minus are inverted so that the minus output voltage is realized.

In order to summarize the operation using the second-order DWA algorithm as described above, (1) "+2" operation: The output voltage equal to +2 times a predetermined reference output voltage (which is accurately, $(C/C_{ref})V_{ref}$ as shown in FIGS. 9A to 9D and FIGS. 10A to 10C) is obtained in the before-mentioned multi-clock operation.

(2) "+1" operation: The output voltage equal to the reference output voltage is obtained in one electrically charging operation and one electrically discharging operation generally performed.

(3) "0" operation: The output voltage equal to the ground voltage is obtained without any electrically charging and discharging operations.

(4) "−1" operation: The output voltage equal to −1 times the reference output voltage is obtained in the before-mentioned minus operation.

Figure 11:
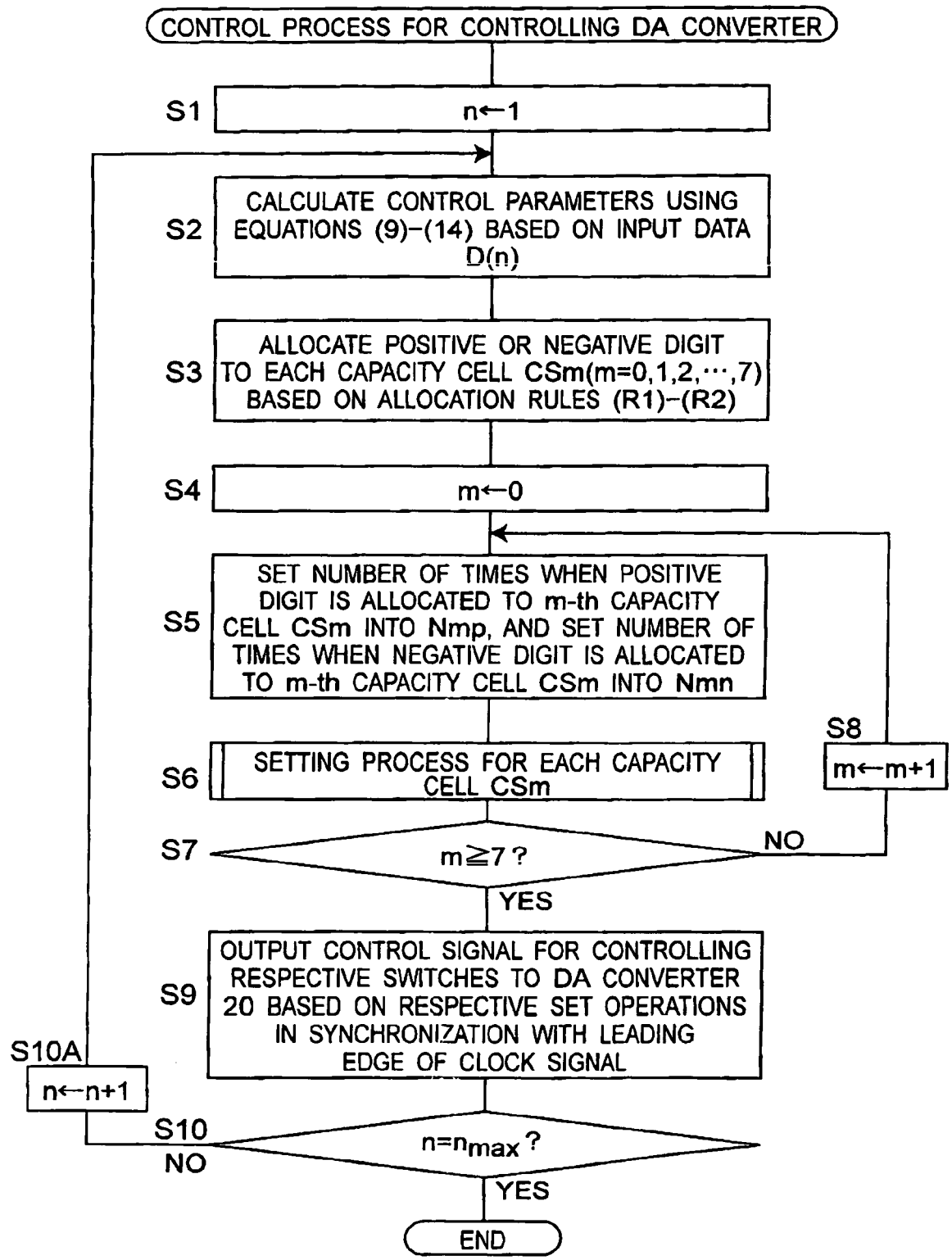
FIG. 11 is a flow chart of a control process for controlling the DA converter, which is executed by a controller 10 shown in FIG. 7.

FIG. 11 is a flow chart of a control process for controlling the DA converter, which is executed by the controller 10 of FIG. 7. The processes of step S1 or step S10A to step S10 are executed during one period of a clock signal.

Figure 12:
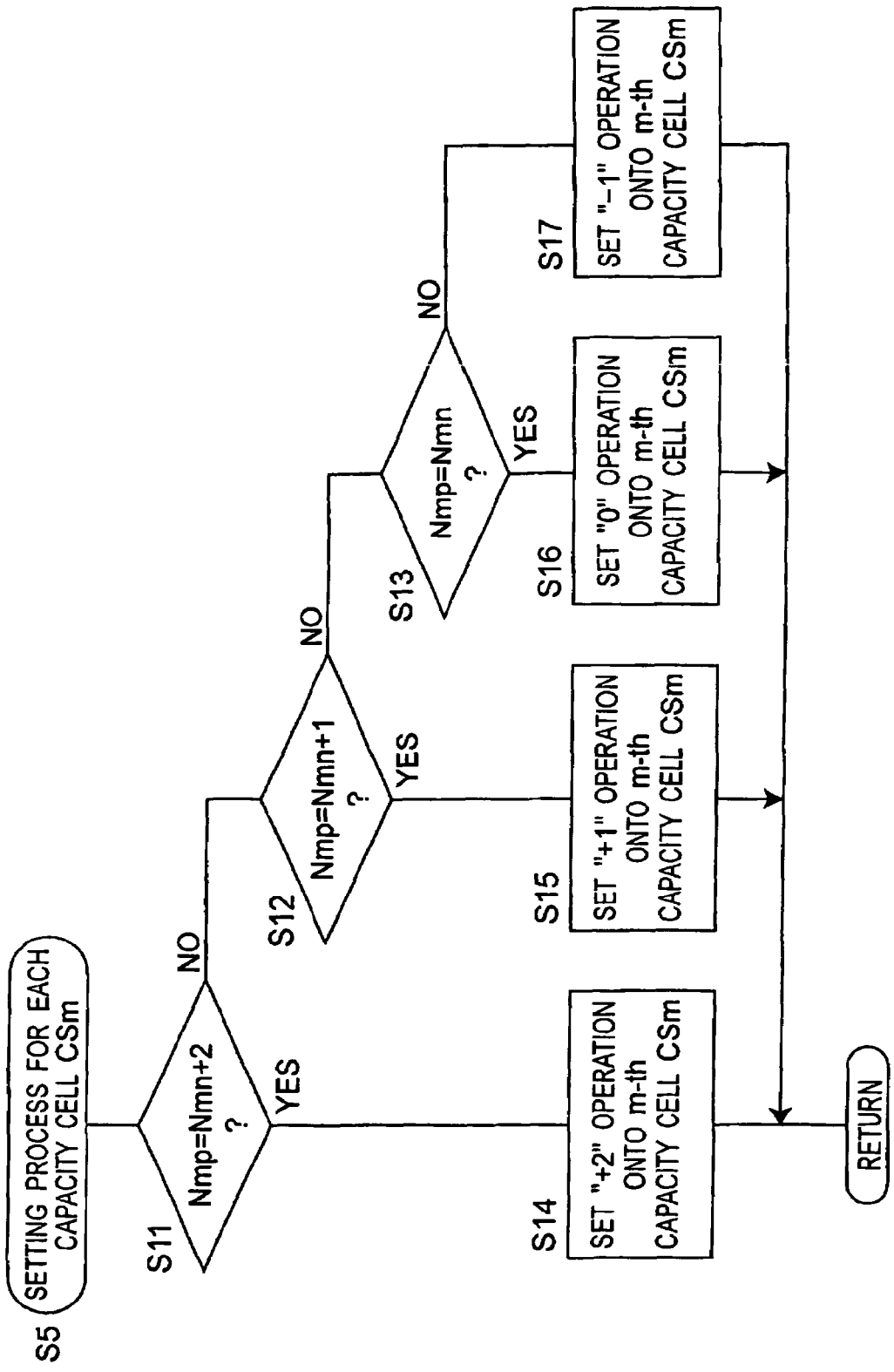
FIG. 12 is a flow chart of a setting process for the capacity cell CSm, which is a subroutine shown in FIG. 11 (step S5)

At step 1 of FIG. 11, first of all, a timing parameter "n" is reset to "1", then, control parameters are calculated using the equations (9) to (14) based on the input data D (n) at step S2. Next, at step S3, the positive or negative digit is allocated to the respective capacity cells CSm (m=0, 1, 2, . . . , 7) based on the before-mentioned allocation rules (R1) and (R2). At step S4, a cell number parameter "m" is reset to "0". At step S5, the number of the allocations of the positive digit to the m-th capacity cell CSm is set to Nmp, and the number of the allocations of the negative digit is set to Nmn. At step S6, "a setting process on the capacity cell CSm", which is a subroutine of FIG. 12, is executed, and then, the process flow proceeds to step S7. At step S7, it is judged whether or not the cell number parameter m≧7, and if NO at step S7, the process flow proceeds to step S8. On the other hand, if YES at step S7, the process flow goes to S9. At step S8, the cell number parameter "m" is incremented by one, and the process flow returns to step S5 to repeat the foregoing steps. At step S9, a control signal for controlling the respective switches is outputted to the DA converter 20 based on the respective set operations in synchronization with a leading edge of the clock signal. At step S10, it is judged whether or not the timing parameter "n" is the maximum value $n_{max}$ thereof, and if NO, the process flow proceeds to step S10A when the judgment is NO. On the other hand, if YES at step S10, the control process is completed. At step S10A, the timing parameter "n" is incremented by one, and the process flow returns to step S2 to repeat the foregoing steps.

FIG. 12 is a flow chart of the setting step for the capacity cell Cm, which is a subroutine of FIG. 11 (step S5).

At step S11 of FIG. 12, it is judged whether or not $N_{mp}=N_{mn}+2$. If YES at step S11, the process flow proceeds to step S14. On the other hand, if NO at step S11, the process flow goes to S12. Next, at step S12, it is judged whether or not $N_{mp}=N_{mn}+1$. If YES at step S12, the process flow goes to step S15. On the other hand, if NO at step S12, the process flow goes to S13. At step S13, it is judged whether or not $N_{mp}=N_{mn}$, and if YES at step S13, the process flow proceeds to step S16. On the other hand, if NO at step S13, the process flow goes to step S17. At step S14, the "+2" operation is set onto the m-th capacity cell Cm, and the process flow returns to the main routine. At step S15, the "+1" operation is set onto the m-th capacity cell Cm, and the process flow returns to the main routine. At step S16, the "0" operation is set onto the m-th capacity cell Cm, and the process flow returns to the main routine. At step S17, the "−1" operation is set onto the m-th capacity cell Cm, and the process flow returns to the main routine.

In the above-mentioned preferred embodiment, the respective switches SW11, SW12 and S1-m to S4-m (m=0, 1, 2, . . . , 7) of the DA converter 20 of segment switched capacitor type including the eight capacitors C0 to C7 for the three-bit DA conversion are controlled by the controller 10 using the "+2" operation, "+1" operation, "0" operation and "−1" operation so as to execute second-order DWA algorithm for performing the second-order noise shaping to the non-linearity of the DA converter circuit for the low-pass ΔΣ AD modulator. This realizes the three-bit (nine-level) DA converter circuit for performing the second-order noise shaping to the non-linearity of the DA converter circuit for the low-pass ΔΣ AD modulator. The present invention is not limited to the foregoing configuration. In an alternative configuration, an L-bit ($2^L$-level) DA converter circuit for performing the second-order noise shaping to the non-linearity of the DA converter circuit for the low-pass ΔΣ AD modulator may be realized so that the respective switches SW11, SW12 and S1-m to S4-m (m=0, 1, 2, . . . , L) of the DA converter 20 of segment switched capacitor type including a number $2^L$ of capacitors C0 to C7 for a multiple L-bit DA conversion are controlled by the controller 10 using the "+2" operation, "+1" operation, "0" operation and "−1" operation so as to execute the second-order DWA algorithm for performing the second-order noise shaping to the non-linearity of the DA converter circuit for the low-pass ΔΣ AD modulator.

IMPLEMENTED EXAMPLES

The inventors of the present invention used a three-bit second-order low-pass ΔΣ AD modulator to carry out simulations using a MATLAB (registered trade mark) in order to verify the effectiveness of the second-order DWA algorithm.

Figure 13:
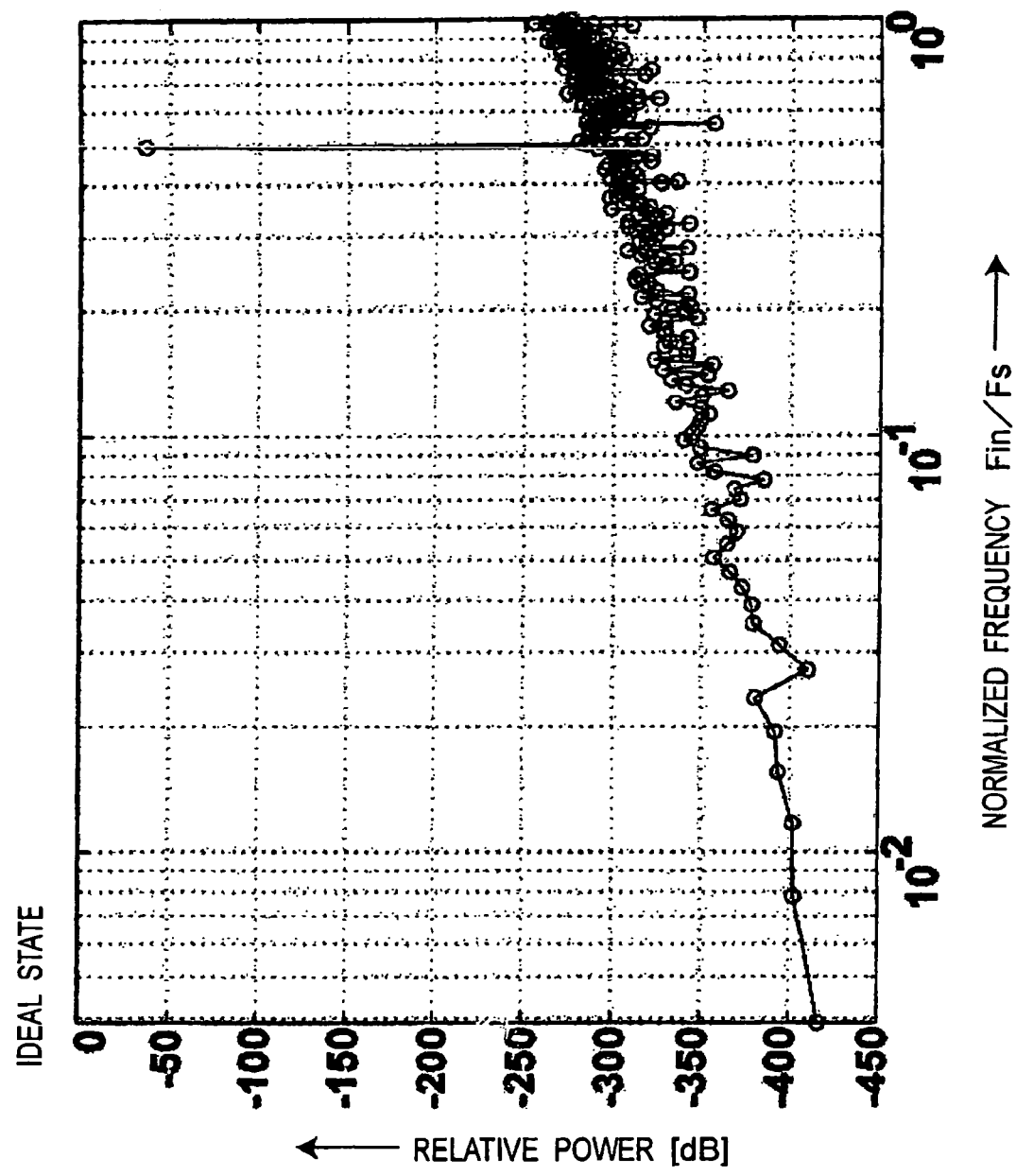
FIG. 13 shows simulation results of the DA converter circuit 50 of FIG. 6, which is a spectral diagram showing a relative power characteristic depending on a normalized frequency in an ideal state.
Figure 14:
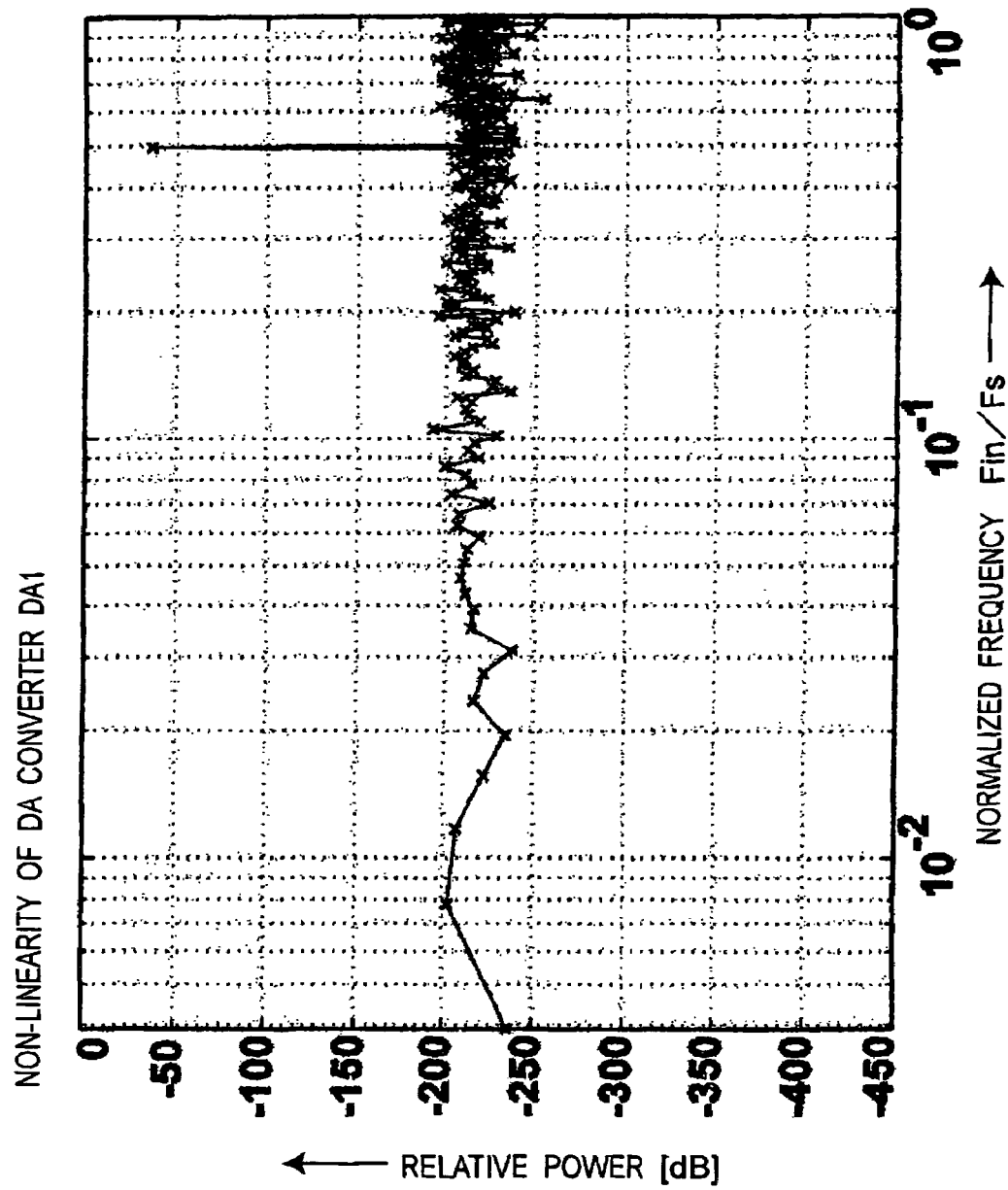
FIG. 14 shows simulation results of the DA converter circuit 50 of FIG. 6, which is a spectral diagram showing a relative power characteristic on the normalized frequency, which shows a non-linearity of the DA converter DA1.
Figure 15:
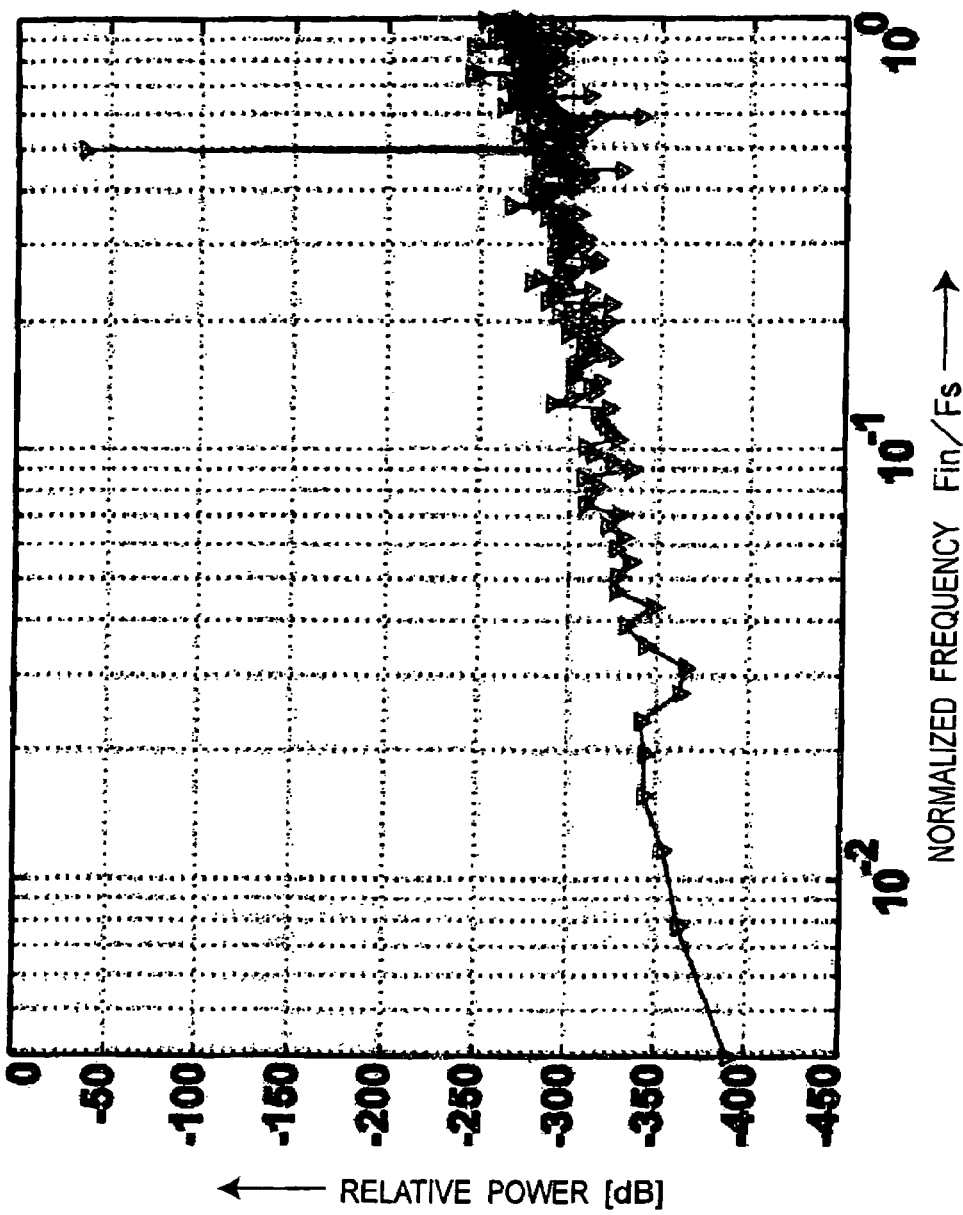
FIG. 15 shows simulation results of the DA converter circuit 50 of FIG. 6, which is a spectral diagram showing a relative power characteristic on the normalized frequency when the first-order noise shaping is performed by the DA converter DA1 using the first-order DWA algorithm.
Figure 16:
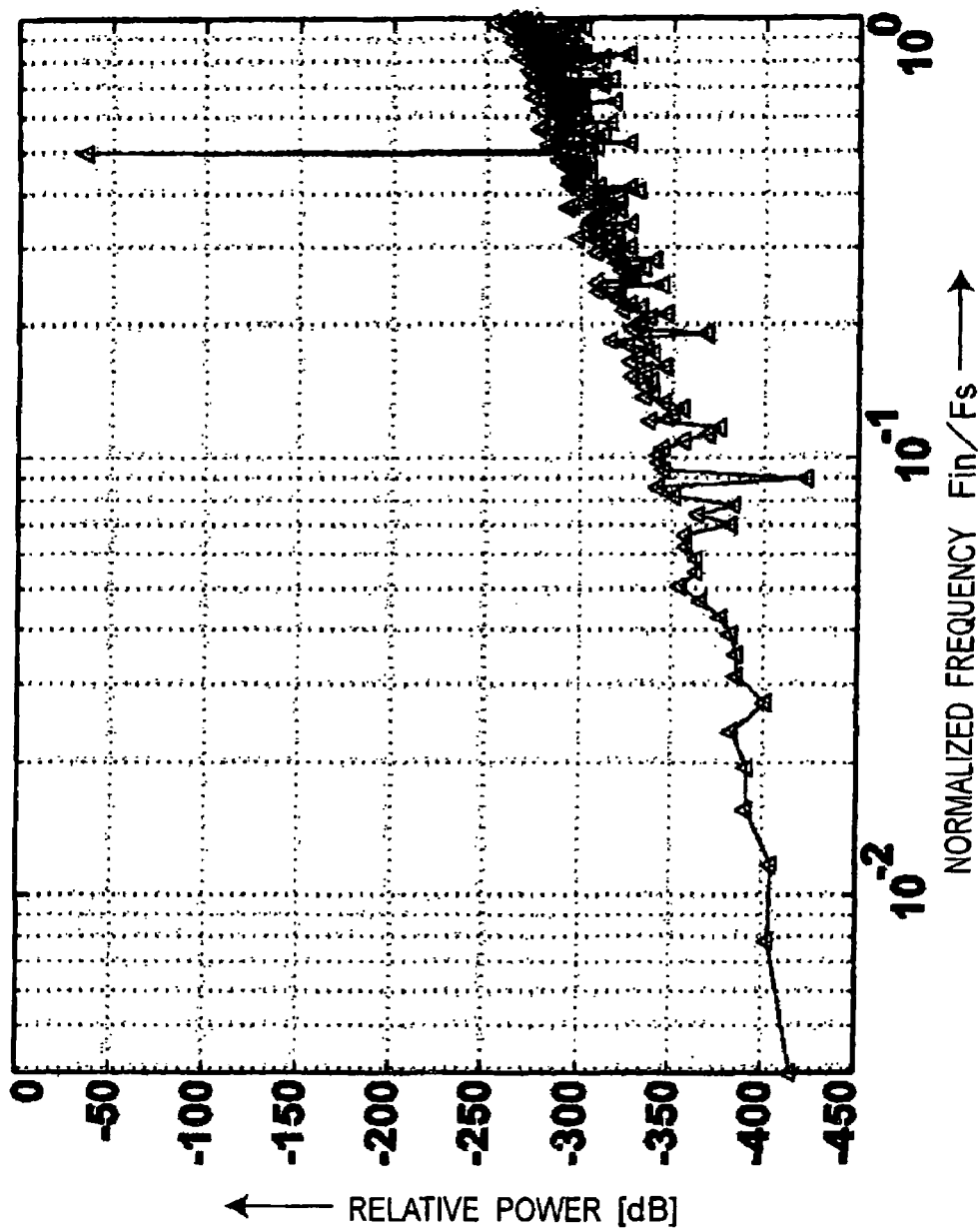
FIG. 16 shows simulation results of the DA converter circuit 50 of FIG. 6, showing a spectral diagram showing a relative power characteristic on the normalized frequency when the second-order noise shaping is performed by the DA converter DA1 using a second-order DWA algorithm.

FIG. 13 shows simulation results of the DA converter circuit 50 of FIG. 7, which is a spectral diagram showing a relative power characteristic on a normalized frequency in an ideal state. In this case, the normalized frequency is defined as an input frequency Fin normalized by a sampling frequency Fs, and it is hereinafter applied in a manner similar to above. FIG. 14 shows simulation results of the DA converter circuit 50 of FIG. 6, which is a spectral diagram showing a relative power characteristic on the normalized frequency, and showing a non-linearity of the DA converter DA1. FIG. 15 shows simulation results of the DA converter circuit 50 of FIG. 7, which is a spectral diagram showing a relative power characteristic on the normalized frequency when the first noise shaping is performed to the DA converter DA1 using the first-order DWA algorithm. FIG. 16 shows simulation results the DA converter circuit 50 of FIG. 7, which is a spectral diagram showing a relative power characteristic on the normalized frequency when the second-order noise shaping is performed to the DA converter DA1 using the second-order DWA algorithm.

As is apparent from FIGS. 13 to 16, it is understood from the results that the non-linear noise of the DA converter exerts a reduced influence in the signal band, and this leads to that a ratio of noise and distortion power relative to a signal power (hereinafter, referred to as SNDR) is prevented from deteriorating, in the case of using the second-order DWA algorithm as compared with the case of using the first-order DWA algorithm.

Figure 17:
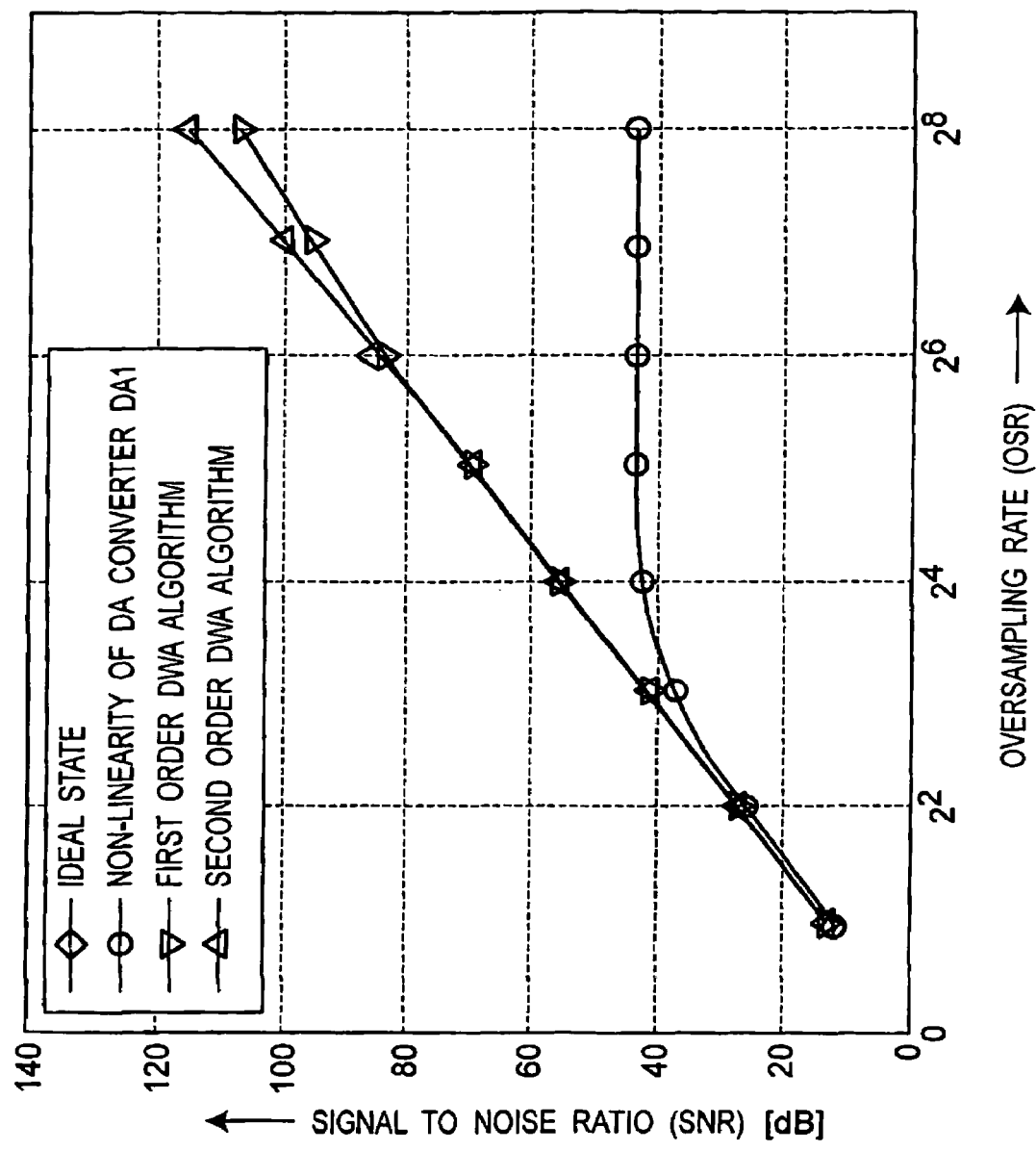
FIG. 17 shows simulation results of the DA converter circuit 50 of FIG. 6, which is a graph showing a signal to noise ratio (SNR) on an oversampling ratio (OSR) in the case of FIGS. 13 to 16.

FIG. 17 shows simulation results of the DA converter circuit 50 of FIG. 7, which is a graph showing a signal to noise ratio (SNR) on an oversampling rate (OSR) in the case of FIGS. 13 to 16. As is apparent from FIG. 17, for example, when the OSR is 28, the SNR is 116.6 dB in the signal to noise plus distortion ratio (SNDR) in the ideal state in which the DA converter does not include the non-linearity. On the other hand, when the DA converter DA1 includes the non-linearity but the DWA algorithm is not used (corresponds to "non-linearity of DA converter" in the drawings), the SNR is 24.7 dB. Further, when the DA converter DA1 includes the non-linearity and the first-order DWA algorithm is used (corresponds to "first-order DWA algorithm" in the drawing), the SNR is 102.7 dB. On the other hand, when the second-order DWA algorithm is used (corresponds to "second-order DWA algorithm" in the drawings), the SNR is 116.0 dB. Thus, the effectiveness of the second-order DWA algorithm was verified.

As described above, according to the present preferred embodiment, the second-order DWA algorithm capable of relatively easily realizing the circuit was examined and the effectiveness thereof was confirmed by way of the simulations. Further, the method of realizing the circuit using the DA converter of segment switched capacitor type was exhibited.

As mentioned in detail above, according to the preferred embodiments of the present invention, there can be provided the DA converter circuit, whose configuration is simpler than that of the prior art, and which is capable of noise-shaping the non-linearity thereof, and the ΔΣ AD modulator using the same DA converter circuit. Accordingly, even in the case of a low-precision device such as a device which is made by the fine processing, the non-linearity of the multi-bit DA converter can be easily controlled, and a signal to noise ratio (SNR) as high as an ideal level can be first available in the practical use.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A DA converter circuit including a DA converter of segment switched capacitor type, said DA converter comprising:

(a) an operational amplifier having a feedback capacity;

(b) a plurality of $M=2^L$ capacitors which are connected in parallel to each other so as to supply electric charges to the operational amplifier;

(c) an electrically charging switch for switching over between performing and not performing of electrically charging electric charges onto the respective capacitors; and (d) an electrically discharging switch for switching over between performing and not performing of electrically discharging electric charges from the respective capacitors, and wherein the DA converter circuit further comprises:

a switch device for performing either electrically charging, the electrically discharging, grounding, or polarity inversion onto the respective capacitors; and a controller for controlling the electrically charging switch, the electrically discharging switch and the switch device so as to execute a process of second-order DWA algorithm for performing a second-order noise shaping of a non-linearity of the DA converter circuit for a low-pass ⊖Σ AD modulator, using the following operations:

(A) a "+2" operation for performing the electrically charging and the electrically discharging twice onto the respective capacitors for a predetermined time interval to generate an output voltage which is a voltage of +2 times a predetermined reference output voltage;

(B) a "+1" operation for performing the electrically charging and the electrically discharging once onto the respective capacitors for the time interval to generate an output voltage which is a voltage of +1 times the reference output voltage;

(C) a "0" operation for not performing any electrically charging and electrically discharging onto the respective capacitors for the time interval to generate an output voltage which is a voltage of a grounding electric potential; and (D) a "−1" operation for performing the electrically charging once onto the respective capacitors and thereafter inverting polarities of the respective capacitors for the time interval to generate an output voltage which is a voltage of −1 times the reference output voltage.

2. The DA converter circuit as claimed in claim 1,
wherein the plurality of M=$2^L$ capacitors are equivalently constituted in a ring shape, and
wherein said controller controls said electrically charging switch, said electrically discharging switch and said switch device by executing the following steps of:
(a) based on input data D(n), calculating control parameters for controlling said switch device of the respective capacitors using the second-order DWA algorithm, said control parameters including:
  (a1) a positive-side pointer indicated value $P_{0+}(n)$;
  (a2) a positive-side signal starting position $S_{0+}(n)$;
  (a3) a positive-side allocation number $A_{0+}(n)$;
  (a4) a negative-side pointer indicated value $P_{0-}(n)$;
  (a5) a negative-side signal starting position $S_{0-}(n)$; and
  (a6) a negative-side allocation number $A_{0-}(n)$,
(b) in respective capacity cells including said respective capacitors, and said switch device connected to said respective capacitors, allocating a "positive digit" to $S_{0+}(n)$-th, $\text{mod}_M(S_{0+}(n)+1)$-th, $\text{mod}_M(S_{0+}(n)+2)$-th, ..., and $\text{mod}_M(S_{0+}(n)+A_{0+}(n)-1)$-th capacity cells, and allocating a "negative digit" to $S_{0-}(n)$-th, $\text{mod}_M(S_{0-}(n)+1)$-th, $\text{mod}_M(S_{0-}(n)+2)$-th, ..., and $\text{mod}_M(S_{0-}(n)+A_{0-}(n)-1)$-th capacity cells;
(c) setting a number of times of allocations of the positive digit to a m-th capacity cell to Nmp, and setting a number of times of allocations of the negative digit to the m-th capacity cell to Nmn; and
(d) (d1) setting the "+2" operation onto the m-th capacity cell when Nmp=Nmn+2; (d2) setting the "+1" operation onto the m-th capacity cell when Nmp=Nmn+1, (d3) setting the "0" operation onto the m-th capacity cell when Nmp=Nnm, and (d4) setting the "−1" operation onto the m-th capacity cell in any case other than the foregoing cases.

3. The DA converter circuit as claimed in claim 2,
wherein L=3,
wherein said DA converter comprises a number m=8 of capacitors, and
wherein said DA converter circuit is of eight bits.

4. The DA converter circuit as claimed in claim 1,
wherein L=3,
wherein said DA converter comprises a number m=8 of capacitors, and
wherein said DA converter circuit is of eight bits.

5. A $\ominus\Sigma$ AD modulator comprising:
a DA converter circuit;
a subtracter for subtracting a signal outputted from the DA converter circuit from an inputted analog signal and outputting a signal having a subtraction result;
a low-pass filter for performing a predetermined low-pass filtering process onto the analog signal outputted from the subtracter and outputting a filtered signal; and
an AD converter circuit for AD-converting the analog signal outputted from the low-pass filter into a digital signal and outputting the AD-converted digital signal and further outputting the digital signal to the subtracter via the DA converter circuit,
wherein said DA converter circuit includes a DA converter of segment switched capacitor type,
wherein said DA converter comprising:
(a) an operational amplifier having a feedback capacity;
(b) a plurality of M=$2^L$ capacitors which are connected in parallel to each other so as to supply electric charges to the operational amplifier;
(c) an electrically charging switch for switching over between performing and not performing of electrically charging electric charges onto the respective capacitors; and
(d) an electrically discharging switch for switching over between performing and not performing of electrically discharging electric charges from the respective capacitors, and
wherein the DA converter circuit further comprises:
a switch device for performing either electrically charging, the electrically discharging operation, grounding, or polarity inversion onto the respective capacitors; and
a controller for controlling the electrically charging switch, the electrically discharging switch and the switch device so as to execute a process of second-order DWA algorithm for performing a second-order noise shaping of a non-linearity of the DA converter circuit for a low-pass $\Delta\Sigma$ AD modulator, using the following operations:
(A) a "+2" operation for performing the electrically charging and the electrically discharging twice onto the respective capacitors for a predetermined time interval to generate an output voltage which is a voltage of +2 times a predetermined reference output voltage;
(B) a "+1" operation for performing the electrically charging and the electrically discharging once onto the respective capacitors for the time interval to generate an output voltage which is a voltage of +1 times the reference output voltage;
(C) a "0" operation for not performing any electrically charging and electrically discharging onto the respective capacitors for the time interval to generate an output voltage which is a voltage of a grounding electric potential; and
(D) a "−1" operation for performing the electrically charging once onto the respective capacitors and thereafter inverting polarities of the respective capacitors for the time interval to generate an output voltage which is a voltage of −1 times the reference output voltage.

6. The $\Delta\Sigma$ AD modulator as claimed in claim 5,
wherein the plurality of M=$2^L$ capacitors are equivalently constituted in a ring shape, and
wherein said controller controls said electrically charging switch, said electrically discharging switch and said switch device by executing the following steps of:
(a) based on input data D(n), calculating control parameters for controlling said switch device of the respective capacitors using the second-order DWA algorithm, said control parameters including:
  (a1) a positive-side pointer indicated value $P_{0+}(n)$;
  (a2) a positive-side signal starting position $S_{0+}(n)$;
  (a3) a positive-side allocation number $A_{0+}(n)$;
  (a4) a negative-side pointer indicated value $P_{0-}(n)$;
  (a5) a negative-side signal starting position $S_{0-}(n)$; and
  (a6) a negative-side allocation number $A_{0-}(n)$,
(b) in respective capacity cells including said respective capacitors, and said switch device connected to said respective capacitors, allocating a "positive digit" to $S_{0+}(n)$-th, $\text{mod}_M(S_{0+}(n)+1)$-th, $\text{mod}_M(S_{0+}(n)+2)$-th, ..., and $\text{mod}_M(S_{0+}(n)+A_{0+}(n)-1)$-th capacity cells, and allocating a "negative digit" to $S_{0-}(n)$-th, $\text{mod}_M(S_{0-}(n)+1)$-th, $\text{mod}_M(S_{0-}(n)+2)$-th, ..., and $\text{mod}_M(S_{0-}(n)+A_{0-}(n)-1)$-th capacity cells;
(c) setting a number of times of allocations of the positive digit to a m-th capacity cell to Nmp, and setting a number of times of allocations of the negative digit to the m-th capacity cell to Nmn; and (d) (d1) setting the "+2" operation onto the m-th capacity cell when Nmp=Nmn+2; (d2) setting the "+1" operation onto the m-th capacity cell when Nmp=Nmn+1, (d3) setting the "0" operation onto the m-th capacity cell when Nmp=Nmn, and (d4) setting the "−1" operation onto the m-th capacity cell in any case other than the foregoing cases.

7. The ΔΣ AD modulator as claimed in claim 5, wherein L=3, wherein said DA converter comprises a number m=8 of capacitors, and wherein said DA converter circuit is of eight bits.

8. The ΔΣ AD modulator as claimed in claim 6, wherein L=3, wherein said DA converter comprises a number m=8 of capacitors, and wherein said DA converter circuit is of eight bits.

* * * * *

UNITED STATES PATENT AND TRADEMARK OFFICE
CERTIFICATE OF CORRECTION

| | |
|---|---|
| PATENT NO. | : 7,095,350 B2 |
| APPLICATION NO. | : 11/157923 |
| DATED | : August 22, 2006 |
| INVENTOR(S) | : Hiroyuki Hagiwara et al. |

It is certified that error appears in the above-identified patent and that said Letters Patent is hereby corrected as shown below:

On Title Page, Item 56
    <u>Page 2, Column 1, Other Publications</u>

The line reading "C. Toumazou et al. (editors), Trade-Offs in Analog Circuit Design, The Designer's Companion, Kluwer Academic Publishers, 2002, pp. 631, 644-645, no month." should read --R. Schreier et al., "Speed vs. dynamic range trade-off in oversampling data converters", in C. Toumazou et al. (editors), Trade-Offs in Analog Circuit Design, The Designers Companion, Kluwer Academic Publishers, 2002, pp. 631, 644-645, no month.--

Signed and Sealed this

Eleventh Day of September, 2007

JON W. DUDAS
*Director of the United States Patent and Trademark Office*